US007103522B1

(12) United States Patent
Shepard

(10) Patent No.: US 7,103,522 B1
(45) Date of Patent: Sep. 5, 2006

(54) METHODS FOR ESTIMATING THE BODY VOLTAGE OF DIGITAL PARTIALLY DEPLETED SILICON-ON-INSULATOR CIRCUITS

(75) Inventor: Kenneth Shepard, Ossining, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 714 days.

(21) Appl. No.: 09/591,270

(22) Filed: Jun. 9, 2000

Related U.S. Application Data

(60) Provisional application No. 60/138,842, filed on Jun. 10, 1999.

(51) Int. Cl.
*G06F 17/50* (2006.01)

(52) U.S. Cl. ............................... 703/14; 703/13; 716/4; 716/5

(58) Field of Classification Search ................. 703/14, 703/13; 716/4, 5
See application file for complete search history.

(56) References Cited

U.S. PATENT DOCUMENTS

| 6,023,577 | A  | * | 2/2000  | Smith et al. .................. 703/14  |
| 6,141,632 | A  | * | 10/2000 | Smith et al. .................. 703/14  |
| 6,281,737 | B1 | * | 8/2001  | Kuang et al. ................ 327/382  |
| 6,429,684 | B1 | * | 8/2002  | Houston ....................... 326/83   |
| 6,442,735 | B1 | * | 8/2002  | Joshi et al. ..................... 716/4 |
| 6,490,546 | B1 | * | 12/2002 | Kimmel et al. ............... 703/14  |
| 6,567,773 | B1 | * | 5/2003  | Rahmat et al. ............... 703/14  |
| 2003/0078763 | A1 | * | 4/2003  | Chuang et al.                       |

OTHER PUBLICATIONS

Shepard, K.L. et al. "Body-Voltage Estimation in Digital PD-SOI Circuits and Its Application to Static Timing Analysis". 1999 IEEE/ACM Int'l Conf. on CAD, Nov. 7-11, 1999. pp. 531-538.*
Shepard, K.L . et al. "Harmony: Static Noise Analysis of Deep Submicron Digital Integrated Circuits". 1999 IEEE Transactions on CAD of Integrated Circuits and Systems. Aug. 1999. pp. 1132-1150.*
Shepard, K.L. "Design Methodologies for Noise in Digital Integrated Circuits". 1998 ACM/IEEE Design Automation Conference. 1998. pp. 94-99.*
Chuang, C.T. "Design Considerations of SOI Digital CMOS VLSI". Proc. 1998 Int'l SOI Conf. Oct. 5-8, 1998. pp. 5-8.*

(Continued)

*Primary Examiner*—Paul L. Rodriguez
*Assistant Examiner*—Ayal Sharon
(74) *Attorney, Agent, or Firm*—Baker Botts LLP

(57) ABSTRACT

Techniques for estimating a body voltage of one or more transistors which form digital partially depleted silicon-on-insulator circuit, and for using estimated voltages to analyze electrical properties of the circuit, are disclosed. In one technique, device models are obtained and abstracted to generate simplified electrical descriptions of the transistors. The circuit topology is checked to generate sets of accessible states for the transistors that are indicative of whether a connection between a source or a drain of a transistor and either a power supply or ground exists. Next, sets of reference state body voltage minima and reference state body voltage maxima are determined for each of the transistors based on corresponding simplified electrical descriptions and corresponding sets of accessible states. Finally, a target state body voltage minima and a target state body voltage maxima are ascertained, one for each transistor, based on the determined sets of reference state body voltage minima and reference state body voltage maxima.

3 Claims, 11 Drawing Sheets

OTHER PUBLICATIONS

Puri, R. and Chuang, C.T. "SOI Digital Circuits: Design Issues". 13th Int'l Conf. on VLSI Design. Jan. 3-7, 2000. pp. 474-479.*

Sinitsky, D. et al. "Simulation of SOI Devices and Circuits using BSIM3SOI". IEEE Electron Device Letters. Sep. 1998. pp. 323-325.*

Tu, R. "Simulation of Floating Body Effect in SOI Circuits Using BSIM3SOI". 1997 Int'l Symposium on VLSI Technology, Systems, and Applications, 1997. Jun. 3-5, 1997. pp. 339-342.*

"ICCAD 1999: San Jose, California, USA". http://www.informatik.uni-trier.de/~ley/db/conf/iccad/iccad1999.html Printed Feb. 18, 2004.*

Shepard, K. and Dae-Jin Kim. "Static Noise Analysis for Digital Integrated Circuits in Partially-Depleted Silicon-On_Insulator Technology." Proc. 37$^{th}$ ACM/IEEE DAC 2000. Jun. 200. pp. 239-242.*

Lu et al., "Floating-body Effects in Partially SOI CMOS circuits", 32 IEEE J. Solid-Stated Circuits 1241 (1997).

D.H. Allen et al., "A 0.20 ÿm 1.8 V SOI 550 MhZ 64b Power PC Microprocessor with Cu Interconnects", Digest Tech. Papers, ISSCC, pp. 438-439, (1999).

C.T. Chuang et al., "SOI Digital CMOS VLSI—A Design Perspective", 36th ACM/IEEE Design Automation Concerence, pp. 709-714, (1999).

J. Gautier et al., "On the Transient Operation of Partially Depleted SOI NMOSFET's", 16 IEEE Electron Device Letters 498 (1995).

R. Puri et al., "Hysteresis Effect in Pass-Transistor-Based Partially-Depleted SOI CMOS Circuits", Proc. Int'l SOI Conf., 1998.

* cited by examiner

METHODS FOR ESTIMATING THE BODY VOLTAGE OF DIGITAL PARTIALLY DEPLETED SILICON-ON-INSULATOR CIRCUITS

This application claims priority to U.S. Provisional Application No. 60/138,842 filed on Jun. 10, 1999.

NOTICE OF GOVERNMENT RIGHTS

The U.S. Government has certain rights in this invention pursuant to the terms of the National Science Foundation award number CCR-97-34216.

BACKGROUND OF THE INVENTION

I. Field of the Invention

The present invention relates to partially depleted silicon-on-insulator technology, and more particularly to techniques for estimating the body voltage of digital integrated circuits and partially depleted silicon-on-insulator ("PD-SOI") technology.

II. Description of the Related Art

Silicon-on-insulator ("SOI") technology has long been used for radiation-hardened or high-voltage integrated circuits. In more recent years, SOI has also been considered for us as a technology for high-performance, low-power deep-submicron digital integrated circuits. For digital applications, fully-depleted devices have been largely abandoned in favor of partially-depleted technology, because of the difficulty in controlling the threshold voltage of fully-depleted thin-film transistors. Partially-depleted SOI ("PD-SOI") technology has two main advantages for digital applications: the reduction of parasitic source-drain depletion capacitances and the reduction of the reverse-body effect in stack structures and pass-transistor logic.

At the device and circuit level, however, the floating body effect in PD-SOI has posed and continues to pose major challenges in the successful use of this technology. As discussed in Pong-Fei Lu et al., "Floating-body Effects in Partially Depleted SOI CMOS circuits, 32 IEEE J. Solid-State Circuits 1241 (1997), there is a parasitic bipolar effect which can result in noise failures if not correctly considered. In addition, there can be large "uncertainties" in the body potential, and consequently the threshold voltage, of devices due to unknown past switching activity. For many circuits, the design margining required to protect against this uncertainty erodes all of the potential performance advantage under nominal operation. In addition, for many circuit styles in which noise margin is strongly determined by threshold voltage (e.g. dynamic circuits), considerable overdesign for noise can also result from conservative body-voltage margining.

Several circuit design techniques, such as those described in D. H. Allen et al., "A 0.20 µm 1.8 V SOI 550 MhZ 64b Power PC Microprocessor with Cu Interconnects," Digest Tech. Papers, ISSCC, pp. 438–39 (1999), and C. T. Chuang et al., "SOI Digital CMOS VLSI—A Design Perspective," 36th ACM/IEEE Design Automation Concerence, pp. 709–714 (1999), attempt to contain the noise impact of the parasitic bipolar current and the delay and noise-margin variation due to the floating body. Some of these design techniques, such as predischarging internal nodes of the nFET pulldown stack in domino logic to avoid parasitic bipolar currents, are quite counter to design practice in bulk.

In addition, previous circuit-level modeling work on PD-SOI has focused either on device issues, or on delay and noise effects due to the floating-body effect evident for particular circuits under periodic stimulus, such as pulse stretching, frequency-dependent delay time. See, for example, J. Gautier et al, "On The Transient Operation of Partially Depleted SOI NMOSFET;s," 16 IEE Electron Device Letters 498 (1995), and R. Puri et al, "Hysteresis Effect in Pass-Transistor-Based Partially-Depleted SOI CMOS Cirsuits," Proc. Int'l SOI Conf. 1998. However, neither such modeling work nor the circuit design techniques discussed above are able to accurately estimate the upper and lower bounds of the body voltage of PD-SOI circuits in order to characterize the important electrical characteristics of the circuit. Accordingly, there exists a need in the field to accurately estimate the upper and lower bounds of the body voltage of PD-SOI circuits, taking into account the past history of the circuit, so that certain important electrical characteristics, such as delay and noise margins, of the circuit can be properly considered without requiring excessively long simulatrons.

SUMMARY OF THE INVENTION

An object of the present invention is to provide a technique for accurately accurately estimate the upper and lower bounds of the body voltage of PD-SOI circuits.

A further object of the present invention is to provide a technique for determining the body voltage of PD-SOI circuits which accounts for the past history of the circuit.

Yet a further object of the present invention is to provide techniques for accurately determining important electrical characteristics, such as delay and noise margins, of PD-SOI circuits.

In order to achieve these objectives as well as others that will become apparent with reference to the following specification, the present invention provides a method for statically estimating a body voltage of one or more transistors which form digital partially depleted silicon-on-insulator circuit. In one technique, one or more device models are obtained and abstracted to generate one or more simplified electrical descriptions, each corresponding to one of the transistors. The device models may be n or p channel Field Effect Transistor models. As part of this abstraction, the circuit topology is then checked to generate one or more sets of accessible states, with each set corresponding to one of the transistors and being indicative of whether under any allowable switching activity, the source, gate, or drain could be high or low. Next, sets of reference state body voltage minima and reference state body voltage maxima are determined for each of the transistors based on corresponding simplified electrical descriptions and corresponding sets of accessible states. Finally, a target state body voltage minima and a target state body voltage maxima are ascertained, one for each transistor, based on the determined sets of reference state body voltage minima and reference state body voltage maxima. This target state reflects the appropriate initial condition for the electrical simulation in question. The electrical simulation in question also determines whether the minima or maxima is used for a given FET.

Preferably, the abstracting step includes abstracting each device model to obtain displacement voltages $d_i$, steady-state reference voltages $V_i^{zero}$, and forward biased reference voltages $V_i^{forward}$, associated with each transistor state i for each such model. Using such abstracting, the determining step advantageously involves determining the minima and maxima reference state body voltage $(V_B^{ref})_{min}$ or $(V_B^{ref})_{max}$ for each transistor in the given circuit. With such a methodology, the present invention advantageously provides for ascertaining one or more target state body voltage minima, and one or more target state body voltage maxima, based on the determined reference state body voltage minima and maxima using either full uncertainty or accessibility analysis, and the displacement abstractions $d_i$.

In an especially preferred technique, an additional step of performing active net tagging on each net in the circuit to determine whether any of nets will switch with regular frequency is performed prior to the determination of reference state body voltage minima and maxima. In this arrangement, the simplified electrical abstractions are the di $V_i^{zero}$ and $V_i^{forward}$ combined with the results of active net tagging, and the determining step advantageously involves determining minimum and maximum reference state body voltages for each transistor in the circuit based on corresponding displacement voltages $d_i$, corresponding sets of accessible states. With this methodology, the present invention also calls for ascertaining one or more minimum target state body voltage minima and one or more target state body voltage maxima, based on the determined reference state body voltage minima and maxima using modified accessibility analysis.

In another preferred technique, the device models are also abstracted to obtain time constant characterizations, and an additional step of calculating signal probabilities and timing windows by Boolean and timing analysis is performed prior to the determination of reference state body voltage minima and maxima. In this arrangement, the determining step advantageously involves determining the sets of reference state body voltage minima and maxima based on corresponding displacement voltages $d_i$, the time constraints, corresponding sets of accessible states, and the results of the calculated signal probabilities and timing windows. With such a methodology, the present invention calls for ascertaining the target state body voltage minima and maxima, based on the determined reference state body voltage minima and maxima using probabilistic analysis.

In order to take advantage of the ability to accurately determine target state body voltage minima and maxima, the present invention provides techniques for analyzing an electrical property of a digital partially depleted silicon-on-insulator circuit. In one preferred methodology, the technique involves ascertaining a target state body voltage minimum and a target state body voltage maximum for each transistor in the circuit, establishing an initial condition for the circuit by selecting either the target state body voltage minimum or the target state body voltage maximum for each transistor, applying a voltage to the circuit, and measuring the sought after electrical property of the circuit.

In accordance with the present invention, the target state body voltage minima and maxima are ascertained alternatively from full uncertainty estimation, accessibility analysis, modified accessibility analysis, or probabilistic analysis. If the sought after electrical property is a switching delay, the measuring step involves measuring a delay between a switching input and a switching output. Such delay measurements can be used as constituent simulations in static timing analysis. If the sought after electrical property is noise, the measuring step involves measuring noise on one or more nets in the circuit such noise measurements can be used as constituent simulations in static noise analysis. In its ability to accurately determine target state body voltage minima and maxima, the present invention fulfills the need to accurately estimate the upper and lower bounds of the body voltage of PD-SOI circuits, taking into account the past history of the circuit, so that certain important electrical characteristics, such as delay, induced noise, and noise margins, of the circuit can be properly considered.

The accompanying drawings, which are incorporated and constitute part of this disclosure, illustrate a preferred embodiment of the invention and serve to explain the principles of the invention.

DESCRIPTION OF PREFERRED EMBODIMENTS

In order to better understand the embodiments disclosed herein, the PD-SOI device physics which underlie the present invention will first be explained. It should be noted that the following description is by way of example and not by limitation, with certain embodiments being described in order to best explain the principles of the present invention.

The body potential of a PD-SOI Field-Effect-Transistor ("FET") is determined by capacitive coupling of the body to the gate, source, and drain, by diode currents at the source-body and drain-body junctions and by impact ionization, currents produced by current flow through the device (referred to as the on-state impact ionization current). The impact ionization currents have a strong supply-voltage dependence, decreasing with decreasing supply voltages and going to zero below 1.1-V supplies.

It is convenient to distinguish "fast" and "slow" processes. Fast processes can change the body potential on time scales on the order of or less than the cycle time, while slow processes require time scales much longer than the cycle time (up to milliseconds) to affect the body voltage. There are two fast mechanisms at work: switching transitions on the gate, source, or drain which are capacitively coupled to the body (which will hereinafter be referred to as coupling displacements), and forward-bias diode currents across source-body and drain-body junctions with voltages exceeding the diode turn-on voltage (which will hereinafter be referred to as body discharge). The slow processes involve charging or discharging the body through reverse-biased or very weakly forward-biased diode junctions and through impact ionization.

Figure 1:
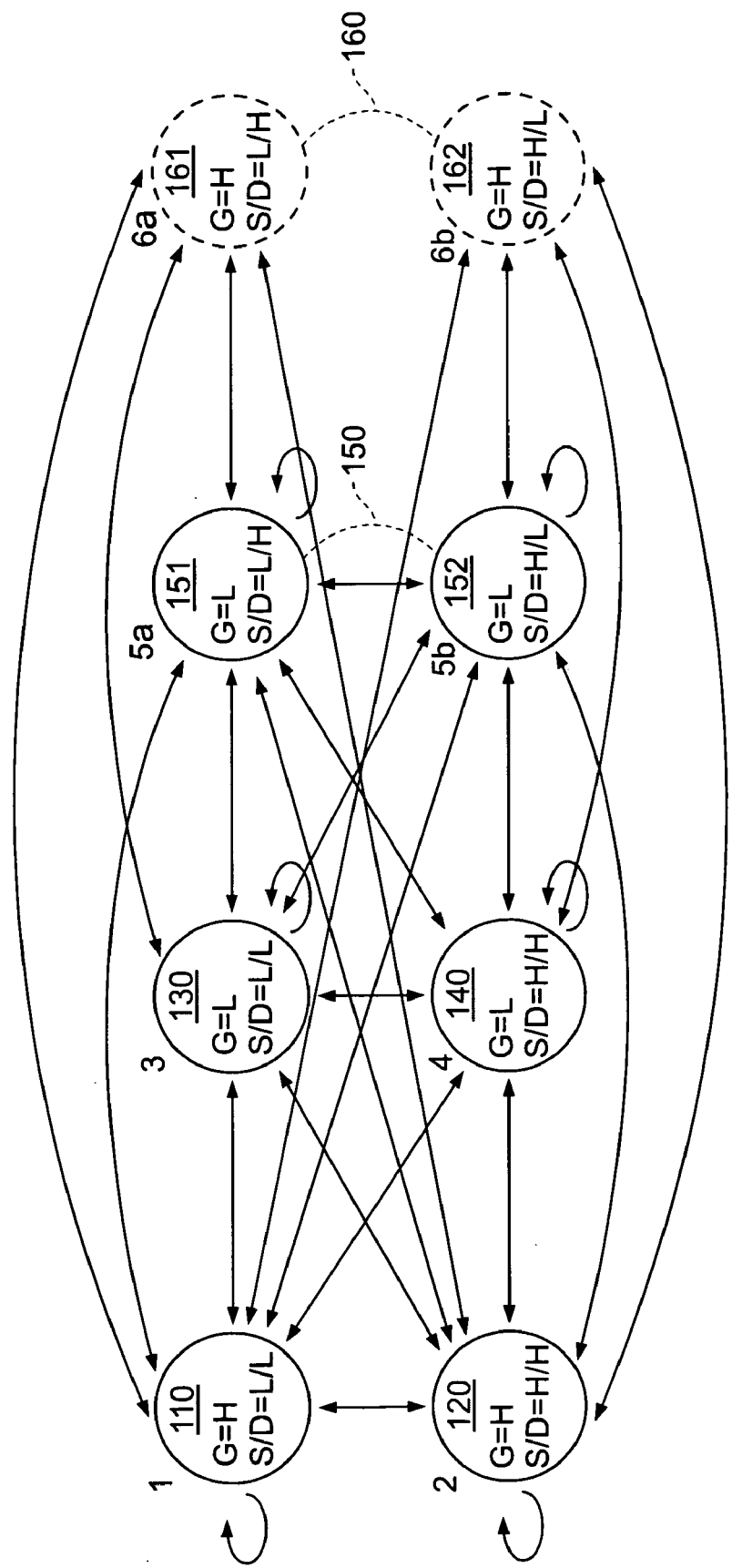
FIG. 1 is a state diagram for a partially depleted silicon-on-transistor pFET.

FIG. 1 is a state diagram abstraction for an nFET which is useful to model the switching history determining the body voltage of a particular device. As a usually dynamic circuit node, the floating body has "memory." The states 110, 120, 130, 140, 151, 152 denoted with solid circles represent "static" states, states in which the FET can be stable. The states 161, 162 are "dynamic" states, which are only present transiently during switching events. For example, state 110 corresponds to the case in which the gate is high and both the source and drain are low. Arrows indicate possible state transitions produced by switching events in the circuits containing these FETs. These switching events can represent transitions from the logic state at the end of the previous cycle to the logic state at the end of the current cycle or can represent hazards that occur transiently within a cycle. States 151 and 152 can usually be treated equivalently as the same state 150; similarly states 161 and 162 can usually be treated equivalently as the same state 160.

While FIG. 1 applies to an nFET, is should be noted that the state diagram of a pFET is similar, in which the gate is high rather than low in states 130, 140, and 150; and low rather than high in states 110, 120, and 160.

If the device is allowed to remain in one state for a very long time, the body voltage in each state will achieve a dc value, hereinafter referred to as si. The dc voltages in states 110 and 130 ($s_1$ and $s_3$) are zero, while the dc voltages in stages 120 and 140 ($s_2$ and $s_4$) are given by the supply voltage. $S_5$ is determined by the steady-state balance between a weakly forward-biased junction drawing current from the body and a reverse-biased junction, leaking current to the body, enhanced by GIDL currents. Similarly, $S_6$ is determined by the steady-state balance between a weakly forward-biased junction drawing current from the body and charging current due to reverse leakage of the other diode junction and on-state impact ionization.

As an example, commercially available BSIM3SOI models for an IBM partially-depleted SOI technology, having a 0.25 μm effective channel length, 5-nm gate oxide, 350-nm back oxide, and 140-nm thin silicon film are considered herein. Those skilled in the art will understand that the present invention applies with equal force to other commercially available and custom fabricated partially-depleted SOI technology.

Using exemplary supply voltages of −1.0 V and 2.5V, Table I lists the values of $s_i$ for each of the six states. The remainder of the information listed in Table I will be explained below.

leakage mechanisms, the body voltage on return will be the same as the initial body voltage, a simple result of charge conservation. Because of this, the charge stored on the body can be represented as the value of the body voltage in one particular state of FIG. 1 (hereinafter referred to as the "reference" state), which is chosen to be state 120 for the nFET and state 110 for the pFET.

From this reference body voltage ($V_B^{ref}$), we can then determine the corresponding body voltage in each state i ($V_B^i$) according to the relationship:

$$V_B^i = V_B^{ref} + d_i(V_B^{ref}) \qquad (1)$$

From (1), The displacements, $d_i$ ($V_B^{ref}$, are explicitly shown to be dependent on the reference body voltage because of the strong voltage-dependence of the capacitances of the source-body, drain-body, and gate-body. $d_i$ is independent of device width W because the dominant components of capacitance scale proportionately with W.

Figure 2A:
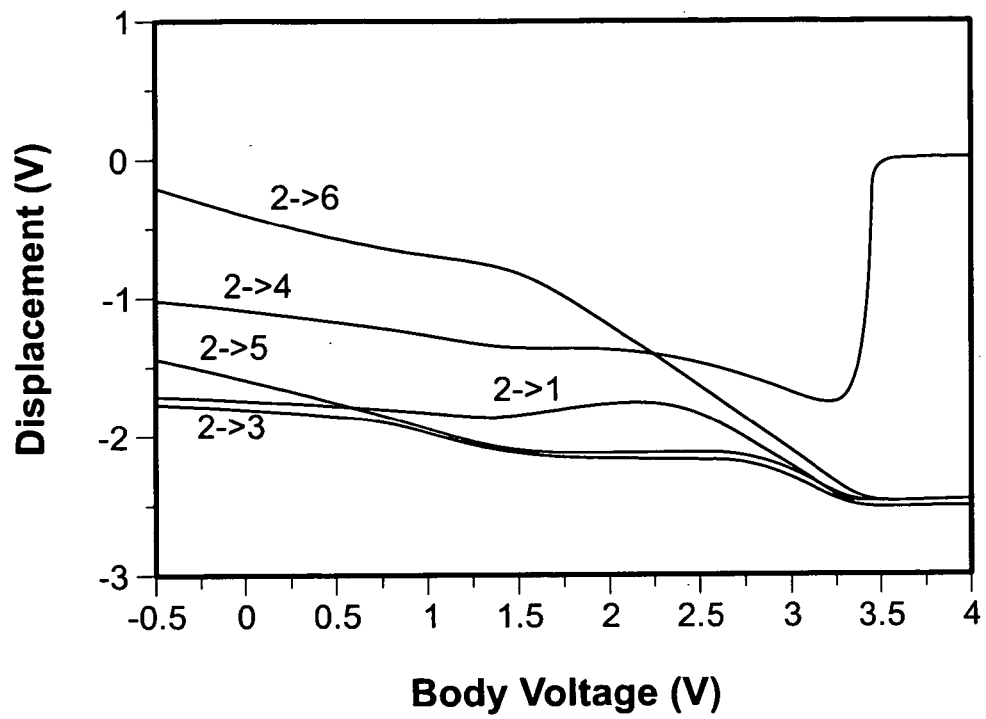
FIGS. 2a and 2b are graphs displacements for an example technology.
Figure 2B:
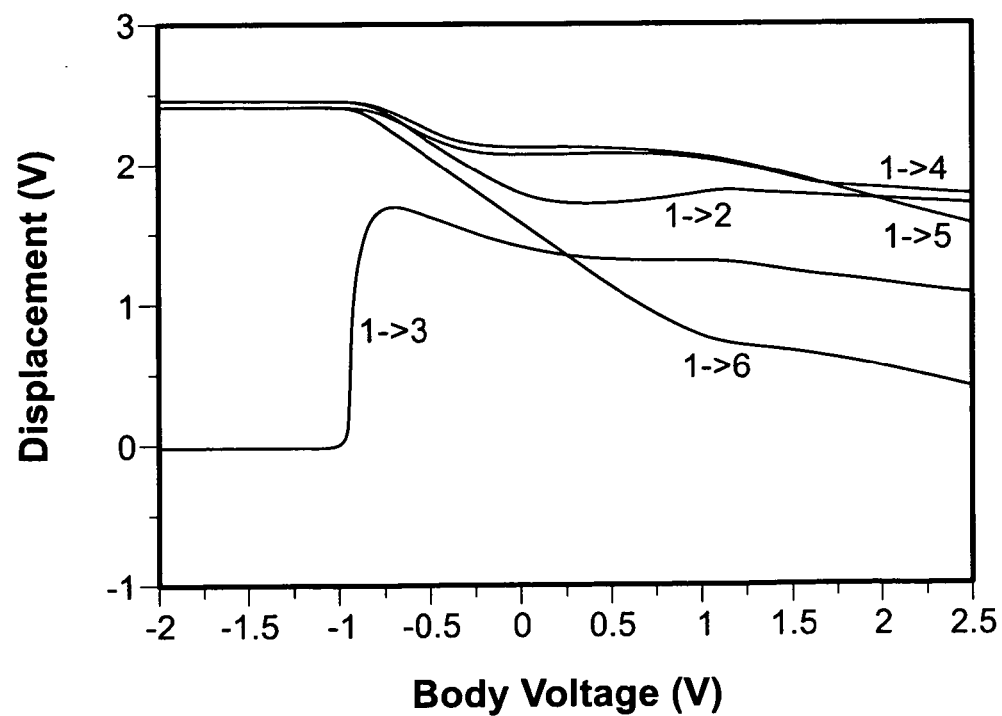

Referring next to FIGS. 2a and b, the displacements are shown as a function of $V_B^{ref}$ for the example technology at the 2.5-V supply, with FIG. 2a illustrating an nFET and FIG. 2b illustrating a pFET. In many cases, these values are not easily determined with direct simulation of a transition from the reference state. For example, reference body voltages for the nFET greater than about 3.1 V would result in strongly forward-biased body-drain and body-source junctions making it difficult to distinguish the displacement due to the transition from state 120 from the body discharge. As a result, these curves are instead determined by isolated evaluation of the MOS C-V model.

With the reference body voltage as a "state-independent" way of representing the charge trapped on the body, each state i in FIG. 1 may be characterized by two values of this reference voltage, $V_i^{zer}$ and $V_i^{forward}$. Referring again to Table I, $V_i^{zero}$ represents the steady-state value of the reference body voltage, achieved by remaining in state i for a long time. This follows immediately from the $s_i$ in each state:

$$s_i = V_i^{zero} + d_i(V_i^{zero}) \qquad (2)$$

$V_i^{forward}$ represents the value of the reference body voltage for the nFET (pFET) to which the body would be very quickly pulled down (up) as a result of body discharge (charge), if state i were accessed with a higher (lower) reference body voltage than $V_i^{forward}$. The values shown in Table I presume that the fast body discharge will bring the forward-biased-junction bias down to a turn-on voltage of

TABLE I

| | nfet | | | pfet | | | nfet | | | pfet | | |
|---|---|---|---|---|---|---|---|---|---|---|---|---|
| | si | $V_i^{zero}$ | $V_i^{forward}$ | si | $V_i^{zero}$ | $V_i^{forward}$ | si | $V_i^{zero}$ | $V_i^{forward}$ | si | $V_i^{zero}$ | $V_i^{forward}$ |
| 1 | 0 | 1.77 | 2.41 | 0.0 | 0.0 | −0.6 | 0.0 | 0.53 | 1.13 | 0 | 0 | −0.6 |
| 2 | 2.5 | 2.50 | 3.1 | 2.5 | 0.73 | 0.12 | 1.0 | 1.0 | 1.6 | 1.0 | 0.469 | −0.127 |
| 3 | 0 | 2.15 | 2.85 | 0.0 | −0.92 | −0.98 | 0 | 0.87 | 1.5 | 0 | −0.75 | −0.907 |
| 4 | 2.5 | 3.43 | 3.5 | 2.5 | 0.35 | −0.30 | 1.0 | 1.75 | 1.906 | 1.0 | 0.14 | −0.5 |
| 5 | 0.437 | 2.58 | 2.79 | 2.068 | −0.045 | −0.23 | 0.278 | 1.12 | 1.47 | 0.722 | −0.118 | −0.47 |
| 6 | 0.711 | 1.60 | 1.60 | 1.976 | 1.24 | 1.24 | 0.357 | 0.61 | 0.85 | 0.722 | 0.467 | 0.17 |

In the absence of body discharge, the coupling displacements that occur with each transition in FIG. 1 are completely reversible on "fast" time scales; that is, if one begins in state 110 and traverses the state diagram, returning to state 110 on a time scale much faster than any of the "slow"

0.6 V; it is also important to note that fast body discharge can trigger parasitic bipolar leakage between source and drain for FETs in state 150. This means, for example, that if a FET which reached a dc steady-state in state 140 (with a $V_B^{ref}$ of 3.3 V) switches into state 120, the reference body voltage will quickly discharge to $V_2^{forward}$=3.1 V. If the FET subsequently remains in state 120 for a long time, $V_B^{ref}$ will eventually decrease to $V_2^{zero}$=2.5V.

An important qualitative difference in the values between $V_i^{zero}$ and $V_i^{forward}$ values the 2.5-V and 1.0-V cases is the 6 state. At a supply voltage of 2.5 V, $V_6^{forward}$=$V_6^{zero}$ (which is not the case at the 1.0-V supply) because of the dominating effect of the on-state impact ionization current. This current is so large that a strongly forward-biased junction is required to balance it in steady-state.

In accordance with the present invention, once the $d_i$ curves and the $V_1^{zero}$ and $V_i^{forward}$ values for each state are obtained, the target state body voltage minima and target state body voltage maxima are estimated. Four illustrative estimation techniques, full uncertainty estimation, accessibility analysis, modified accessibility analysis, and probabilistic analysis, may be used to ascertain approximate values of the target state body voltage minima and target state body voltage maxima. Each is discussed in turn.

In the first technique, full-uncertainty estimation, no knowledge of the switching activity of the circuit is assumed. The maximum and minimum possible values of the body voltage that cover all possible stimulus and history are chosen. A state is accessible if the circuit topology allows the state to be visited. As an example, for the nFET of an inverter, those states with the source high would not be accessible, because the source of the nFET is tied to ground. If A represents the set of all such accessible states, including possibly the dynamic state 160, the minimum and maximum body voltages are given by (3) and (4):

$$\left(V_B^{ref}\right)_{max} = \max_{j \in A} V_j^{zero} \quad (3)$$

$$\left(V_B^{ref}\right)_{min} = \min_{j \in A} V_j^{zero} \quad (4)$$

For the second technique, accessibility analysis, it is assumed that the circuit is under steady switching activity such that every accessible state is visited with reasonable frequency, i.e., on a time scale that is faster than the "slow" body-voltage mechanism. Under such conditions, the $V^{for-ward}$ values for the nFET (pFET) will cap the maximum (minimum) possible value of the body voltage, and values for the pFET will cap the minimum possible value of the body voltage. For the nFET, $$\left(V_B^{ref}\right)_{min} = \min_{j \in A} V_j^{zero} \quad (5)$$

$$\left(V_B^{ref}\right)_{max} = \min\left(\min_{j \in A} V_j^{zero}; \min_{j \in A_{static}} V_j^{forward}\right) \quad (6)$$

while for the pFET, $$\left(V_B^{ref}\right)_{min} = \max\left(\min_{j \in A} V_j^{zero}; \max_{j \in A_{static}} V_j^{forward}\right) \quad (7)$$

$$\left(V_B^{ref}\right)_{max} = \max_{j \in A} V_j^{zero} \quad (8)$$

The assumption here is that it does not matter how long an accessible state is visited; it will be long enough to discharge the body down to the forward-bias turn-on voltage of the source-body or drain-body diodes. In general, state 160 is omitted from this "accessibility" analysis ($A_{static}$ is used in the above equations) because state 160 is a switching state and, therefore, cannot be assured to meet this criterion. In those cases in which the relaxation in state 160 is extraordinarily "fast" because of a large on-state impact ionization current, state 160 can be safely included in the accessibility analysis.

While accessibility analysis does not require detailed switching knowledge, it does require that there is enough switching activity that every accessible state is visited with a minimum frequency. At times, this, too, may be difficult to ensure. The third technique, which shall be referred to as modified accessibility analysis, permits the marking of signals in the design as "active" signals, i.e., signals that are assured to switch with regular frequency. As those skilled in the art will appreciate, clock nets can usually be tagged. This active net tagging establishes a set of constraints that must be satisfied by a modified accessibility set of states, $A_{ma}$. These are states that must be visited as a result of the "active" net switches. The body voltage is determined by equations identical to those used for ordinary accessibility analysis, except that $A_{static}$ is replaced by $A_{ma}$. Thus, for the nFET, $$\left(V_B^{ref}\right)_{min} = \min_{j \in A} V_j^{zero} \quad (9)$$

$$\left(V_B^{ref}\right)_{max} = \min(\max_{j \in A} V_j^{zero}; \min_{j \in A_{ma}} V_j^{forward}) \quad (10)$$

while for pFET.

$$\left(V_B^{ref}\right)_{min} = \max\left(\min_{j \in A} V_j^{zero}; \max_{j \in A_{ma}} V_j^{formula}\right) \quad (11)$$

$$\left(V_B^{ref}\right)_{max} = \max_{j \in A} V_j^{zero} \quad (12)$$

$A_{ma}$ will be the accessibility set for the nFET (pFET) which satisfies the constraints while ensuring the maximum (minimum) value of the body voltage. As in accessibility analysis, modified accessibility analysis explicitly excludes the dynamic state 160 from $A_{ma}$. These constraints are derived from the following four rules:

(1) If the gate of the FET is an active net, then there must be a state in $A_{ma}$ with the gate high and a state in $A_{ma}$ with the gate low.

(2) If the source of the FET is connected to ground through a succession of transistors all of whose gates are active nets, then $A_{ma}$ Must contain a state with the source low. If connected to supply, then $A_{ma}$ Must contain a state with the source high.

(3) If the drain of the FET is connected to ground through a succession of transistors all of whose gates are active nets, then $A_{ma}$ must contain a state with the drain low. If connected to supply, then $A_{ma}$ Must contain a state with the source high.

(4) Same-signal correlations must be considered and can result in stronger constraints. For example, if gate of the current FET is marked as an active net, but must be high for a path to ground from the source to be present through a path of active-gate FETs, then $A_{ma}$ must contain a state in which both the gate is high and the source is low.

Figure 3:
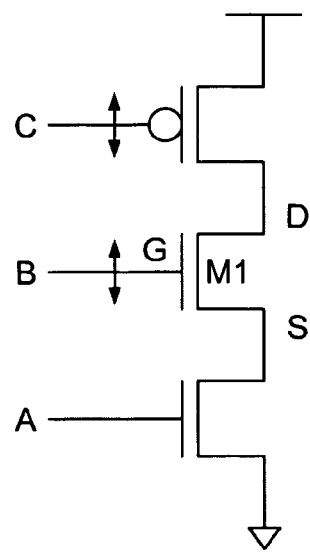
FIG. 3 is an illustrative drawing showing the application of modified accessibility analysis to an exemplary circuit.

Referring to FIG. 3, modified accessibility analysis is illustrated with reference to an exemplary circuit. Nets C and B (marked with the arrows) are active nets. For transistor M1, therefore, there must be a state in $A_{ma}$ with the source and gate both high, with the gate low, and with the drain high.

TABLE II

| i | nfet | | | pfet | | |
|---|---|---|---|---|---|---|
| | si | $V_i^{zero}$ | $V_i^{forward}$ | si | $V_i^{zero}$ | $V_i^{forward}$ |
| 1 | 0 | 1.78 | 2.37 | 0.0 | 0.0 | −0.6 |
| 2 | 2.5 | 2.50 | 3.1 | 2.5 | 0.736 | 0.12 |
| 3 | 0 | 2.16 | 2.79 | 0 | −0.9315 | −0.9505 |
| 4 | 2.5 | 3.43 | 3.45 | 2.5 | 0.349 | −0.225 |
| 5 | 0.421 | 2.54 | 2.72 | 2.079 | −0.026 | 0.225 |
| 6 | 0.560 | 1.3 | 1.36 | 2.078 | 1.373 | 1.15 |

Table II lists values of $V_{i,}^{zero}$ and $V_{i,}^{forward}$ for the nFET and pFET in the circuit of FIG. 3. To find $A_{ma}$ that satisfies these constraints and achieves the maximum value of $V_B^{ref}$, refer to Table II and begin with the state of largest $V_i^{forward}$. Adding state 140 to $A_{ma}$ satisfies the drain-high constraint and the gate-low constraint. State 120 satisfies the constraint that there must be a state with the source and drain both high. Therefore, $A_{ma}\{140, 120\}$ and $(V_B^{ref})_{max}=3.1$ V.

The fourth and most complex technique presented herein for estimating the target state body voltage minima and target state body voltage maxima shall be referred to as probabilistic analysis. In this technique, the estimates provided by the simple uncertainty modes are tightened with stochastic techniques and timing information from static timing analysis. Thus, the behavior of the body over a long period of time is determined by reference to an average cycle repeated over and over.

Figure 4:
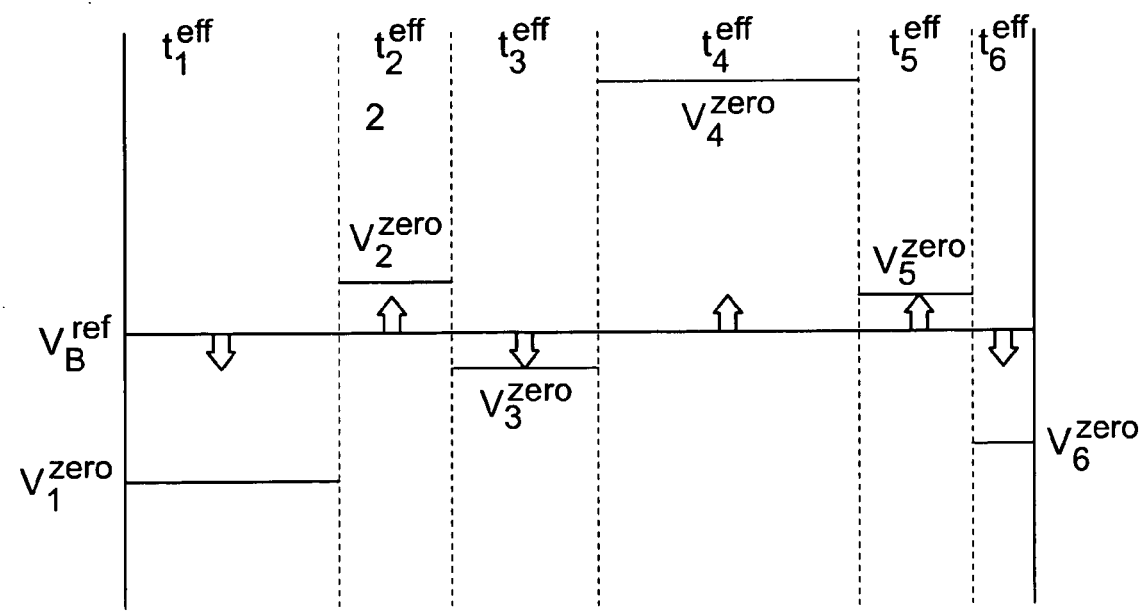
FIG. 4 is an illustrative diagram showing an average cycle divided into a series of time slices.

In probabilistic analysis, two average cycles are characterized, one to minimize and one to maximize the body voltage. Referring to FIG. 4, such an average cycle is shown, divided into a series of time slices $t_i^{eff}$, which characterize the amount of time per cycle on the average that the FET spends in state i. The time slices sum to the cycle time, in accordance with equation 13:

$$\sum_{i=1}^{6} t_i^{eff} = t_{cycle} \quad (13)$$

In each time slice i, the reference body voltage is relaxing to the target value $V_i^{zero}$ with a characteristic relaxation time denoted by $\tau_i$. The body-voltage-dependent time constants for this relaxation are denoted by the $\tau_i$ and can be captured from the device models as part of a technology precharacterizationm, which may be a piecewise-linear representation of the logarithm of $\tau_i$ as a function of $V_B^{ref}$, since $\tau_i$ varies over several orders of magnitude. Moreover, $\tau_i$ is independent of device width W because both the body currents and body capacitance scale proportionately with W.

Except for the fast discharge associated with a source-body or drain-body junction that becomes strongly forward biased, these time constants are much larger than $t_{cycles}$, and any voltage change during a single time slice would be imperceptible in FIG. 4. From the foregoing, the reference body voltage at the end of the cycle $V_{n+1}$ can be related to the reference body voltage at the beginning of the cycle $V_n$ by equation 14:

$$V_{n+1} = V e \sum_{i=1}^{6} -t_i^{eff}/t_i + \sum_{i=1}^{6} V_i^{zero}(1 - e^{-t_i eff/t_i})_e \sum_{j=i+1}^{6} t_j^{eff}/t_j \quad (14)$$

The steady-state solution of this difference equation (in the approximation that the $\tau_i$ are much greater than $t_{cycle}$) is given by equation 15:

$$V_B^{ref} = \frac{\sum_{i=1}^{6} (t_i^{eff}/T_i) V_i^{zero}}{\sum_{i=1}^{6} t_i^{eff}/T_i} \quad (15)$$

Because of the $V_B^{ref}$-dependence of the $\tau_i$ these equations must be solved self-consistently.

Figure 5A:
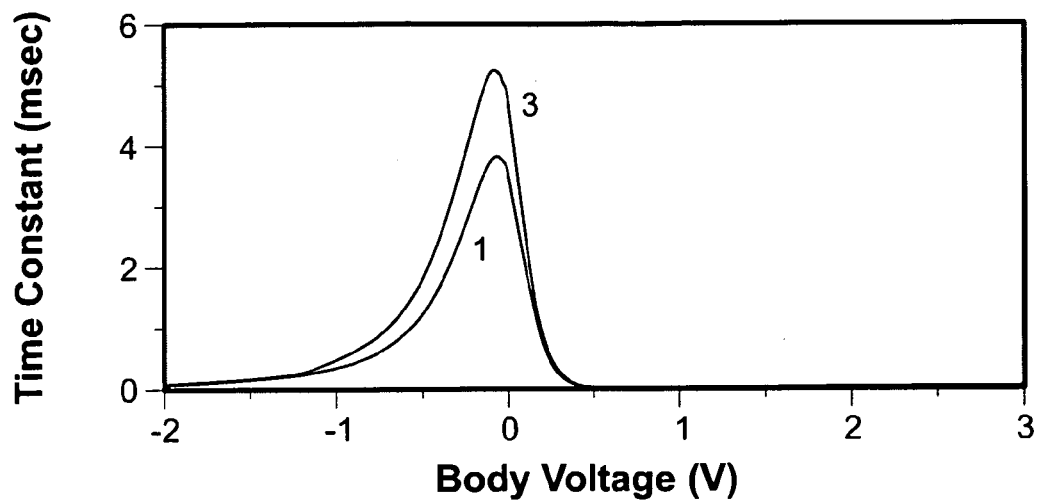
FIGS. 5a–c are graphs plotting the relaxation times $\tau_i$ for an nFET with a 2.5-V supply as a function of local body voltage.
Figure 5B:
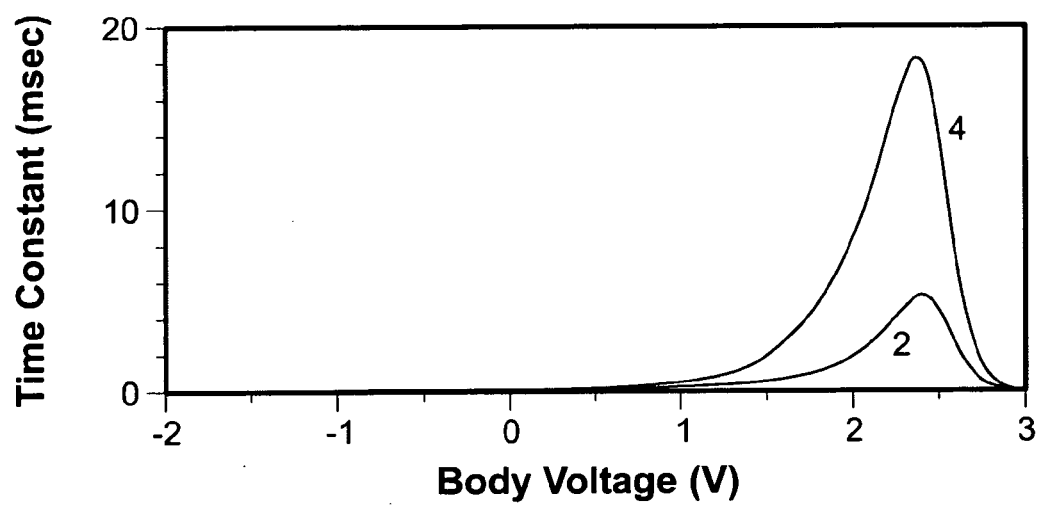
Figure 5C:
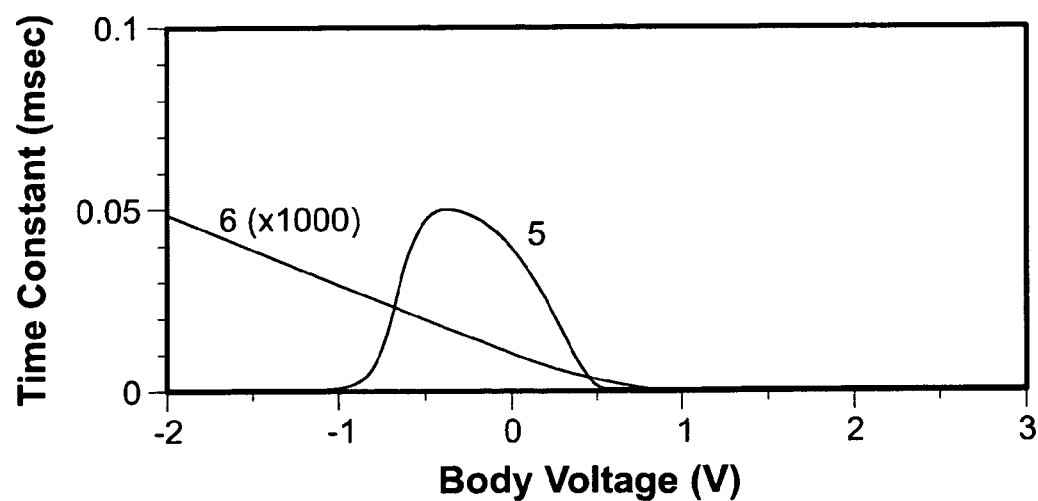

FIGS. 5a–c plot the relaxation times $\tau_i$ for the nFET at the 2.5-V supply as a function of the "local" body voltage (that is, the body voltage in state i rather than the reference body voltage). The relaxation times $\tau_1$ and $\tau_3$, for states 110 and 130, peak around a zero body voltage and then decrease for negative body voltage as the source-body and drain-body leakage currents increase. The decrease for positive body voltage is even more substantial as the junctions become forward biased and draw significant current. The same trends are observed for the relaxation times $\tau_2$ and $\tau_4$, for states 120 and 140, where the relaxation times peak around the supply voltage, indicating that the source and drain are both at the supply voltage for states 120 and 140.

The relaxation time $\tau_5$ for state 150 peaks around zero. For voltages above the peak, $\tau_5$ decreases strongly as the body-source junction becomes forward biased. For voltages below the peak, $\tau_5$ also decreases as both the body-source and body-drain junctions become more reverse-biased. $\tau_5$ peaks at a much smaller time-constant value than $\tau_1$ through $\tau_4$ because even at a body voltage near the peak, one of the junctions (the drain-body junction) is strongly reversed biased and, therefore, leaking considerable current.

For state 160, the time constants are considerably smaller (factor of 1000) than they are in state 150. This is due to the contribution of the on-state impact ionization current to the leakage currents from the floating body; a very low relaxation time will mean that devices that have any time in state 160 in their switching transients will have their body voltages effectively "pinned" at $S_6$. At 1.0 V, by contrast, $\tau_5$ and $\tau_6$ are comparable in magnitude.

In probabilistic analysis, the maximum and minimum possible $V_B^{ref}$ values from Equation 15 are ascertained upon consideration of all of the allowable $t_i^{eff}$. If the $T_i$ in Equation 15 were constant and equal, then to maximize $V_B^{ref}$ one would simply maximize the time in those states with higher $V_i^{zero}$ (subject to constraints on the maximum and minimum possible values of the $t_i^{eff}$ imposed by the stochastic analysis); similarly, to minimize $V_B^{ref}$ one must maximize the time in those states with lower $V_i^{zero}$. The $\tau_i$ however, are not constant, but because they have the property that they decrease rapidly for $V_B^{ref}$ different from $V_i^{zero}$ states with the largest $|V_b^{ref} - V_i^{zero}|$ continue to have the biggest "pull" and the $V_i^{zero}$ "ordering rule" continues to hold. To formalize this, the rank of the state i is defined as an integer $r_i$ indicating the priority of states to maximize the body voltage. Higher ri means higher priority. For example, from Table I, for the nFET at 2.5 V, $r_4=6$, $r_5=5$, $r_2=4$, $r_3=3$, $r_1=2$, and $r_6=1$. A complementary rank, $r_i$, can also be defined for minimizing $V_B^{ref}$; these priorities are simply the reverse of the maximum case. Such ordering, which favors states with high source or drain voltages to maximize the body voltages while favoring states with low source or drain voltages to minimize the body voltages, is technology-independent except for the relative positions of state 150 and 160, which depend on both technology and supply voltage.

Figure 6A:
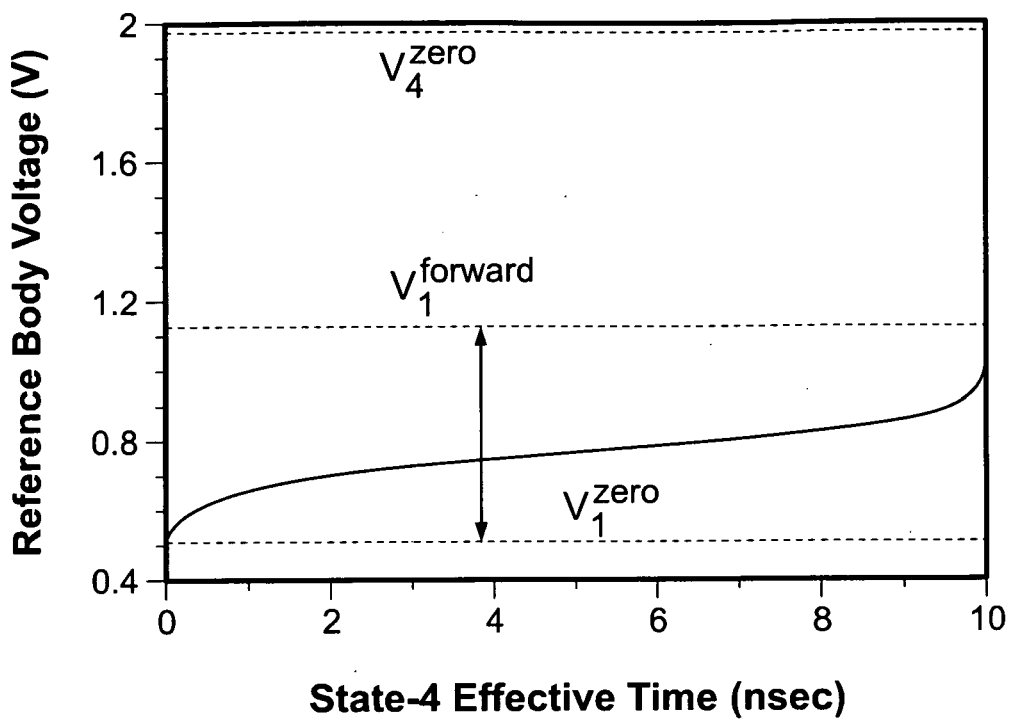
FIGS. 6a and 6b are graphs plotting reference body voltage against effective time.
Figure 6B:
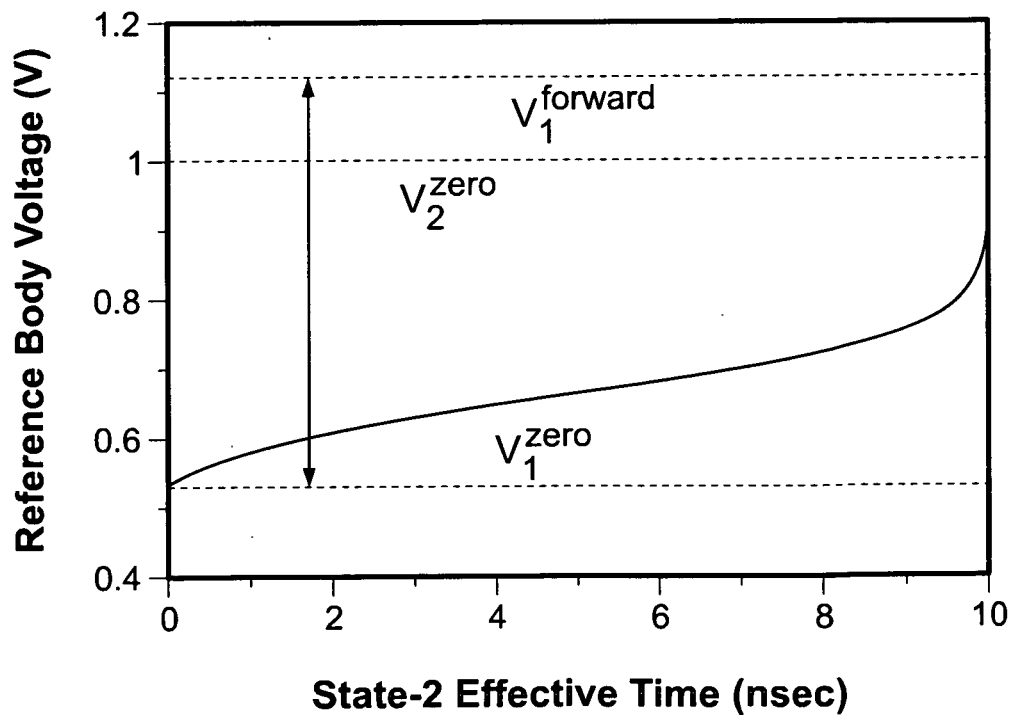

Referring next to FIGS. 6*a–b*, cycle times for the nFET at the 1.0-V supply is shown as an example of how the steady-state body voltage depends on the $t_i^{eff}$. The cycle time $t_{cycle}$ is 10 nsec. FIG. 6(*a*), assumes a hypothetical case in which only states 110 and 140 are accessible, and plots the reference body voltage as a function of $t_4^{eff}$ given that $t_1^{eff}=t_{cycle}-t_4^{eff}$.

The values of $V_1^{zero}$; $V_1^{forward}$; $V_4^{zero}$ are also noted. Given the accessibility of states 110 and 140, the range from $V_1^{zero}$ to $V_1^{forward}$ (denoted with the arrow), would be given by accessibility body-voltage estimation. The probabilistic body voltage estimate becomes $V_1^{zero}$ as $t_4^{eff} \to 0$ and monotonically increases with increasing $t_4^{eff}$ ($r_4>r_1$). As $t^{eff} \to t_{cycle}$ (and $t_1^{eff} \to 0$). $V_B^{ref}$ rapidly increases to $V_4^{zero}$. $V_B^{ref}$ can only increase above $V_1^{forward}$ with $t_1^{eff}=0$ on the scale of the "fast" forward-biased discharge of the body.

In FIG. 6(*b*), the case in which only states 110 and 120 are accessible is illustrated. $V_B^{ref}$ increases monotonically as $t_2^{eff}$ increases ($r_2>r_1$). In this case, $V_2^{zero}<V_1^{forward}$ so that $V_B^{ref}$ as $t_2^{eff}$ does not actually reach the upper bound of accessibility analysis.

To determine allowable values of $t_i^{eff}$ for probabilistic analysis, information about the circuit environment of each transistor in the circuit, both logical and temporal, is required. The logical environment of each FET is therefore characterized by a set of signal probabilities which determine the possible states of the source, gate, and drain of the transistor at the end of a cycle. For the nFET, it is preferred that seven signal probabilities are used, as follows:

(1) P(G)=probability that at the end of a cycle the gate is driven high;

(2) P(D|$\overline{G}$)=probability that at the end of a cycle the drain is driven high given that the gate is low;

(3) P($\overline{D}$|$\overline{G}$)=probability that at the end of a cycle the drain is driven low given that the gate is low;

(4) P(S|$\overline{G}$)=probability that at the end of a cycle the source is driven high given that the gate is low;

(5) P($\overline{S}$|$\overline{G}$)=probability that at the end of a cycle the source is driven low given that the gate is low;

(6) P(S|G)=P(D|G)=probability that at the end of a cycle the drain (and source) are driven high given that the gate is high; and (7) P($\overline{S}$|G)=P($\overline{D}$|G)=probability that at the end of a cycle that the drain (and source) are driven low given that the gate is high.

The corresponding probabilities for the pFET are: P(G), P(S|G), P($\overline{S}$|G), P(D|G), P($\overline{D}$|G), P(S|G)=P(D|G), P($\overline{S}D$|$\overline{G}$)=P($\overline{DD}$|$\overline{G}$). The term "driven low" means that there is a path to ground; "driven high" means that there is a path to supply. The following conditions on the conditional signal probabilities must hold:

$$P(D|G)+P(\overline{D}|G) \leq 1$$

$$P(D|\overline{G})+P(\overline{D}|\overline{G}) \leq 1$$

$$P(D|G)+P(\overline{D}|G) \leq 1$$

$$P(D|\overline{G})+P(\overline{D}|\overline{G}) \leq 1 \tag{16}$$

None of these have to sum to precisely 1 because of the possibility of floating nodes. With these signal probabilities, one can view the state diagram in FIG. 1 as representing a Markov process with six-by-six transition matrix A. Assigning different transition matrices to the minimum and maximum cases yields difference equations 17 and 18, where the six-by-six matrices $A_{max}$ and $A_{min}$ are given 19 and 20:

$$(P_i^{max})_{k+1} = A_{max}(P_i^{max})_k \tag{17}$$

$$(P_i^{min})_{K+1} = A_{min}(P_i^{max})_k \tag{18}$$

$$A_{max} = (P_1^{max} P_2^{max} P_3^{max} P_4^{max} P_{5a}^{max} P_{5b}^{max})T \\ x(111111) \tag{19}$$

$$A_{min} = (P_1^{min} P_2^{min} P_3^{min} P_4^{min} P_{5a}^{min} P_5^{min})T \\ x(111111) \tag{20}$$

In equations 17–20, $(P_i)k$ is the probability of being in state i at the end of cycle k, and $p_i$ is the probability of making a transition to state i and follows directly from the source, gate, and drain signal probabilities. For example, for the nFET, $$P_3^{max} = (1 - P(G))P(\overline{S} | \overline{G})P(\overline{D} | \overline{G})$$

while $$P_3^{min} = (1 - P(G))(1 - P(S | \overline{G}))(1 - P(D | \overline{G})).$$

The maximum case assumes that the floating node condition on the source or drain takes a high voltage value; the minimum case assumes that the floating node condition on the source or drain takes a low voltage value.

Diagonalizing the matrix A and finding the eigenvector associated with eigenvalue 1 (normalized so that the sum of the elements of the vector is 1) gives the steady-state values of the $P_1$. From these probabilities, one can calculate a set of thirty-six transition probabilities (that is, the probability that at given FET in a given cycle is transitioning from state i to state j) for both the minimum or maximum cases, in accordance with equation 21:

$$P_{i \to j}^{max} = P_i^{max} P_j^{max} \text{ and } P_{i \to j}^{min} = P_i^{min} P_j^{min}. \tag{21}$$

Next, the fraction of the cycle time ($t_i^{j \to k}$) that can be spent in each state i is determined as part of the transition j→k to maximize (or minimize) the body voltage among the set of possible waveforms. To do this, early and late arrival times (rising and falling) for the source, gate, and drain of the FET under consideration (the target FET) are required. The seven early times are and are denoted as follows:

(1) $S_{rise}^{early}$. Earliest time the source of the FET can be driven high;

(2) $S_{fall}^{early}$. Earliest time the source of the FET can be driven low;

(3) $D_{rise}^{early}$. Earliest time the drain of the FET can be driven high;

(4) $D_{fall}^{early}$. Earliest time the drain of the FET can be driven low;

(5) $G_{fall}^{early}$. Earliest time the gate of the FET can be driven low;

(6) $G_{rise}^{early}$. Earliest time the gate of the FET can be driven high; and (7) $G_{early}^{rise}$. Earliest time the gate of the FET can be driven high.

There are comparable arrival times associated with the late state: $S_{rises}^{late}$, $S_{fall}^{late}$, $D_{rise}^{late}$, $D_{fall}^{late}$, $G_{fall}^{late}$, and $G_{rise}^{late}$. For the source and drain arrival time, the target FET is assumed to be off.

Each transition has associated with it a set of arrival times necessary to make that transition, a transition set, denoted as $T_{i \to j}$. For example, for the 110→120 transition for the nFET, the associated arrival time set is $T_{i \to 2} = \{S_{rise}, D_{rise}\}$ For 110→140 for the nFET, the associated arrival time set is $T_{1 \to 4} = \{G_{fall}, S_{rise}, D_{rise}\}$. The max and min operators which act on the transition sets are defined such that $\max(T_{i \to j})$ returns the largest of the early arrival times in the transition set, while $\min(T_{i \to j})$ returns the smallest of the late arrival times in the transition set.

To indicate the states of FIG. 1 involved in a cycle and to handle the possibility of hazards, the waveform in a cycle (in this case involving a transition from i to j) is denoted using a transition notation as follows:

$$i \xrightarrow{\max} k \xrightarrow{\min} j$$

In this cycle, a hazard to state k occurs as part of the transition. The transition notation must involve only static states and indicates the amount of time spent in each of these static states as part of the transition. Specifically for this example, $$t_i^{i \to j} = \max(T_{i \to k}); \quad t_k^{i \to j} = \min(T_{k \to j}) - \max(t_{i \to k});$$

$$\text{and } t_j^{i \to j} = t_{cycle} - \min(T_{k \to j}).$$

Hazards are introduced when they act to increase (in the case that we are seeking the maximum body voltage) or decrease (in the case that we are seeking the minimum body voltage) the steady-state body voltage that would result from the particular waveform being repeated indefinitely.

This transition analysis determines the $t_i^{j \to k}$ for the static states i. $t_6^{j \to k}$ depends, in principle, on the number of switching events in a cycle which occur as a result of current flow through the target device. Each such switching event contributes an amount $t_{switch}$ to $t_j^{j \to k}$ where $t_{switch}$ is the approximate switching time of the FET. For the purposes of probabilistic body-voltage estimation, it is assumed that if state 160 is accessible, exactly one switching event occurs per cycle.

In practice, the detailed results are not very sensitive to the number of assumed switching events or the exact value of $t_{switch}$. For cases in which the on-state impact ionization current is large, any $$t_6^{j \to k} > 0$$

produces pinning at $V_B^{ref} = V_6^{zero} V_6^{forward}$. For cases in which the on-state impact ionization does not dominate the current to the body in state 160, $t_6^{eff}$ is usually much smaller than the $t_i^{eff}$ associated with the static states. As a result, probabilistic body voltage has very little sensitivity to the exact value of $t_6^{eff}$.

From the $t_i^{j \to k}$ determined above, an effective amount of time ($t_i^{eff}$) on the average per cycle that the FET is in the state i is determined by two sets of $t_i^{eff}$ values, one to maximize and one to minimize the body voltage in accordance with equations 23 and 24:

$$(t_i^{eff})^{max} = \sum_{j,k} P_{j \to k}^{max} (t_i^{j \to k})^{max} \qquad (23)$$

$$(t_i^{eff})^{min} = \sum_{j,k} P_{j \to k}^{min} (t_i^{j \to k})^{min} \qquad (24)$$

Figure 7:
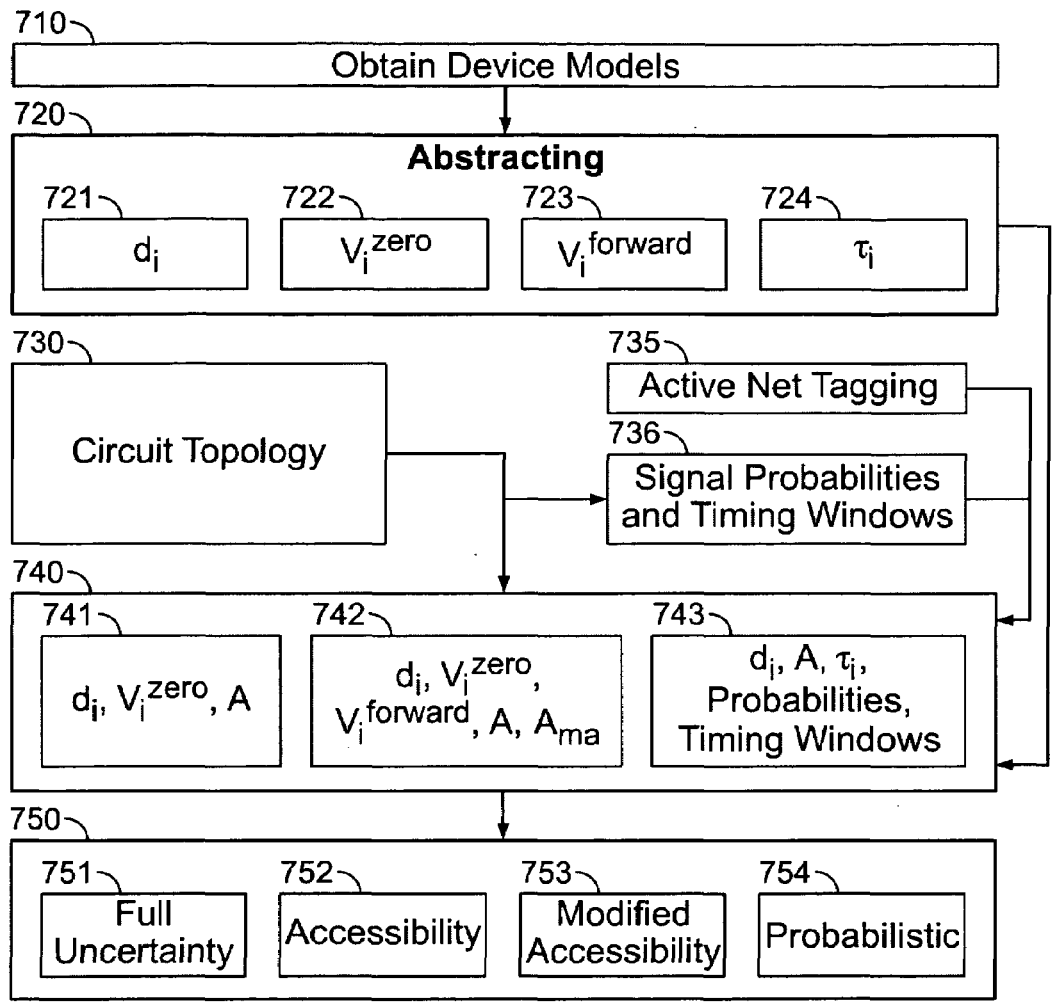
FIG. 7 is a flow diagram of the preferred process implemented by the present invention.

Referring next to FIG. 7, the steps executed by a computer (not shown) executing software to implement the techniques described above will be described. In step 710, one or more device models (n or p channel Field Effect Transistor models) are obtained. In step 720, the device models are abstracted to generate one or more simplified electrical descriptions, each corresponding to one of the transistors. As discussed above, the abstracting step may include abstracting each device model to obtain displacement voltages $d_i$ 721, steady-state reference voltages $V_i^{zero}$ 722, and forward reference voltages $V_i^{forward}$ 723, for each such model. Time constant characterizations 724 are conditionally abstracted in the event that probabilistic determination is employed.

In step 730, the circuit topology is checked to generate one or more sets of accessible states, with each set corresponding to one of the transistors and being indicative of whether a connection between a source or a drain of a transistor and either a power supply or ground exists. The conditional step 735 of performing active net tagging on each of net in the circuit to determine whether any of nets will switch with regular frequency is performed where modified accessibility analysis is employed. An alternative conditional step 736 of calculating signal probabilities and timing windows from the time constant characterizations by boolean and timing analysis is performed where probabilistic determination is employed.

In step 740, sets of reference state body voltage minima and reference state body voltage maxima are determined for each of the transistors based on corresponding simplified electrical descriptions and corresponding sets of accessible states. As discussed above, this step may include determining the sets of reference state body voltage minima and maxima based on corresponding displacement voltages $d_i$ and on corresponding set of accessible states 741, on corresponding displacement voltages $d_i$, corresponding sets of accessible states, and from the results of the active net tagging 742, or on corresponding displacement voltages $d_i$, corresponding sets of accessible states, and from the results of the calculated signal probabilities and timing windows 743, depending on the type of analysis being performed.

Finally, in step 750, the target state body voltage minima and a target state body voltage maxima are ascertained, one for each transistor, based on the determined sets of reference state body voltage minima and reference state body voltage maxima. Full uncertainty estimation 751, accessibility analysis 752, modified accessibility analysis 753 or probabilistic analysis 754 may be employed.

In order to take advantage of the ability to accurately determine target state body voltage minima and maxima, techniques for analyzing an electrical property of a digital partially depleted silicon-on-insulator circuit are now described. In one illustrative embodiment, the technique involves ascertaining a target state body voltage minimum and a target state body voltage maximum for each transistor in the circuit, establishing an initial condition for the circuit by selecting either the target state body voltage minimum or the target state body voltage minimum for each transistor, applying a voltage to the circuit, and measuring the sought after electrical property of the circuit. Techniques for analyzing two exemplary electrical properties, switching delay and noise, are now discussed.

First, the body-voltage estimates described above are applied to a static transistor-level timing analysis engine, or a SOI Static Timing Analyzer ("SOI-STA"), in order to analyze the electrical property of switching delay. The results for full-uncertainty, accessibility and probabilistic analysis are considered, although modified accessibility could also be easily applied in the context of static timing analysis. The design is partitioned into channel-connected components (CCCs) for analysis, as is traditionally done in static transistor-level tools. SOI-STA utilizes a breadth-first search (BFS) of the resulting timing graph, which ensures that the arrival times on all of the inputs are known when the delay through the CCC must be calculated. This enables detailed body-voltage estimates on all of the FETs of the CCC to be used in delay simulation. Delay propagation through a CCC occurs as a result of a single switching event on an input (i.e., simultaneously switching inputs are not considered). Depending on the degree of knowledge of past switching activity (no knowledge, quiescent, steady switching, steady switching with known signal probabilities and arrival times), one of the techniques discussed above (full-uncertainty, initial-condition, accessibility, detailed) is employed to determine the minimum and maximum possible value the reference body voltage can have for each FET of the CCC under analysis. For the given sensitization of the CCC for delay calculation, each FET is in a known state, the minimum or maximum body voltage of which can be determined by a displacement from the reference voltage. The body voltage values are then used as the "initial conditions" for the required delay simulation.

Early-mode calculation for rising transitions sensitizes the nFETs of the pull-up path to be maximum and (to reduce the "fight" during switching) the nFETs of the pull-down path to be minimum; similar calculation for the pFETs of the pull-up path to be minimum and the pFETs of the pull-down path to be maximum.

This same sensitization applies to late-mode fall transitions. Early-mode calculation for falling transitions sensitizes the nFETs of the pull-down path to be maximum and the nFETs of the pull-dup path to be minimum, and falling transitions sensitizes the pFETs of the pull-down path to be minimum and the pFETs of the pull-dup path to be maximum.

The same sensitization applies to late-mode rising transitions. The fanout CCCs are included in the delay calculation to improve the delay accuracy. To maximize device capacitance for late-mode, the maximum nFET and minimum pFET body voltages are used. To minimize device capacitance for early-mode, the minimum nFET and maximum pFET body voltages are used.

SOI-STA propagates full piecewise-linear ("PWL") waveforms. One of the complexities of BFS timing analysis is determining the late- and early-mode waveforms at the output of each CCC. It can sometimes be the case that the waveform with the maximum (minimum) delay (as measured by the 50-percent point) is not the waveform with the slowest (fastest) slew (as measured by the 20-to-80-percent rise-fall time). In these cases, a "hybrid" waveform is propagated, chosen with the largest slew as the late-mode waveform and translate it in time so that is has the largest delay, or with the smallest slew as the early-mode waveform and translate it in time so that is has the smallest delay. SOI-STA also propagates signal probabilities using assumptions of spatial and temporal independence, borrowing from similar techniques in static power analysis. If probabilistic body-voltage estimation is used, once the signal probabilities and arrival times are known at the inputs of a CCC, these probabilities are translated into FET signal probabilities and arrival time values.

Figure 8:
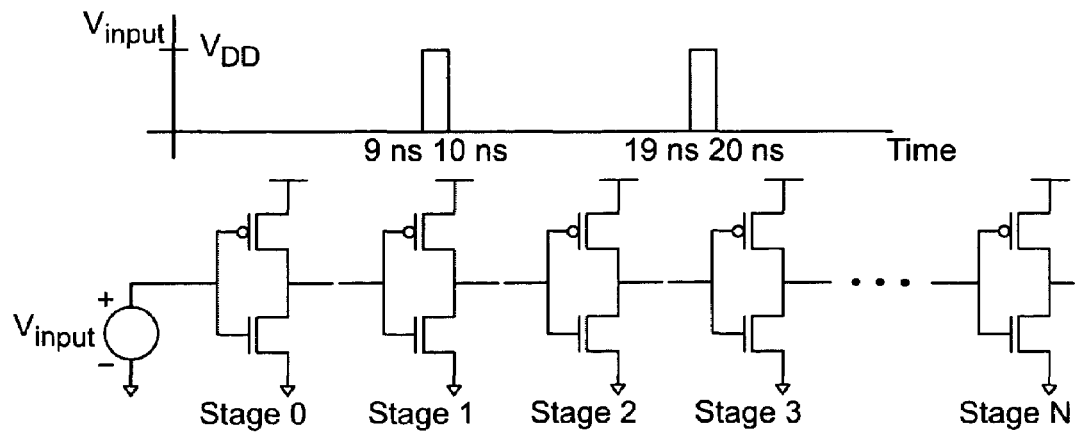
FIG. 8 is an illustrative diagram showing a chain of inverters.

Referring next to FIG. 8, a 4-2 compressor circuit from a tree multiplier design is examined as an example of the advantageous use of the static transistor-level timing analysis presented herein, with the long delay path, I4-Ap-C-D-E-F-S, and the short delay path, I2-C-E-S, being considered. In the dynamic analysis, input waveforms of "50% duty cycle" are sued to sensitize these paths, corresponding to signal probabilities of 0.5 on all of the inputs in SOI-STA detailed steady-state analysis. In Table III, the initial-condition delays determined by circuit simulation are compared with the SOI-STA-determined full-uncertainty delays.

TABLE III

| | SOI-STA full-uncertainty | | | | SPICE initial | | | |
|---|---|---|---|---|---|---|---|---|
| | Short Path | | Long Path | | Short Path | | Long Path | |
| | rise | fall | rise | fall | rise | fall | rise | fall |
| I2 | 100 | 100 | 100 | 100 | 100 | 100 | 100 | 100 |
| I4 | 100 | 100 | 100 | 100 | 100 | 100 | 100 | 100 |
| Ap | | | 302 | 491 | | | 235 | 315 |
| C | 301 | 317 | 866 | 712 | 326 | 379 | 476 | 432 |
| D | | | 1057 | 1079 | | | 723 | 553 |
| E | 526 | 533 | 1421 | 1359 | 1390 | 762 | 785 | 943 |
| F | | | 1620 | 1697 | | | 1112 | 936 |
| S | 672 | 685 | 1926 | 1829 | 1790 | 837 | 1104 | 1174 |

Table IV does a similar comparison between the steady-state delays determined by circuit simulation (after more than 50,000 cycles of simulation) and the SOI-STA-determined probabilistic ("detailed")and accessibility steady-state delays. In all cases, the SOI-STA-determined delays bound the SPICE delays. One should also notice the considerable reduction in uncertainty between the full-uncertainty and probabilistic steady-state delays, as the component of this uncertainty due to body voltage variation is noticeably reduced.

TABLE IV

| | SOI-STA probabilistic | | SOI-STA accessibility | | SPICE steady-state | |
|---|---|---|---|---|---|---|
| | Short Path | Long Path | Short Path | Long Path | Short Path | Long Path |
| I2 | 100  100 | 100  100 | 100  100 | 100  100 | 100  100 | 100  100 |
| I4 | 100  100 | 100  100 | 100  100 | 100  100 | 100  100 | 100  100 |
| Ap | | 267  409 | | 296  449 | | 266  362 |
| C | 464  485 | 706  605 | 389  365 | 804  673 | 488  503 | 594  576 |
| D | | 897  877 | | 1007  999 | | 784  794 |
| E | 970  985 | 1168  1146 | 733  746 | 1332  1287 | 1040  1017 | 1059  1099 |
| F | | 1363  1409 | | 1540  1590 | | 1246  1352 |
| S | 1372  1347 | 1610  1534 | 1026  986 | 1812  1737 | 1384  1365 | 1508  1483 |

The body-voltage estimates described above are next applied to transistor-level static noise analysis, in order to analyze the noise immunity of the circuit. In this case modified accessibility analysis is considered for estimatics, although full uncertainty, accessibility, or probabilistic estimation could be applied to the circuit. As in the static time case, the approach involves decomposing the design into a collection of channel-connected components ("CCCs"), transistors that are connected together through their sources and drains. The maximum noise that is possible on each net is calculated as a time-domain waveshape. This worst-case noise considers all possible noise sources: leakage, charge-sharing noise, coupling though the interconnect, and power-supply noise. This is done with a careful choice of vectors on the driving CCCs, referred to as the sensitization, which produces this worst case noise.

Noise can also propagate from CCC-input to CCC-output (propagated noise). Noise failures are determined by the noise stability, a type of AC noise margin analysis, of each CCC given the worst case noise appearing at its inputs. This involves calculating the transient sensitivity of the output noise with respect to the dc-level of the input noise. While the special considerations associated with applying static noise analysis to PD-SOI circuits is discussed herein, the article by K. L. Shepard et al., "Harmony: Static Noise Analysis for Deep-Submicron Digital Integrated Circuit," IEEE Trans. CAD 1132–1150 (1999), the disclosure of which is incorporated by reference herein, provides more details on static noise analysis generally.

There are two important considerations for static noise analysis for PD-SOI circuits. The first is that all of the body voltages must be initialized as part of the CCC analysis used to calculate the noise on each node as well as the CCC analysis used to determined the noise stability of the gate. These body voltages are calculated using the modified accessibility analysis described above. The approach here is straightforward and depends on the noise type being calculated. Two types of noise on each CCC output, $V_H$ noise, which is noise that pulls the output down from the supply level, and $V_L$ noise, which is noise that pulls the output up from ground, are calculated.

When calculating $V_H$ noise on a CCC output (or when verifying noise stability in the case that $V_H$ noise is introduced at the output), all of the devices in the pull-down stack are initialized to maximize the device strength by minimizing threshold voltages (maximum body voltages for nFETs and minimum body voltages for pFETs). This increases the strength of these devices in introducing noise. Similarly, all the devices in the pull-up paths are initialized to minimize device strengths by maximizing threshold voltages (maximum body voltages for pFETs and minimum body voltages for pFETs). This reduces the strength of these devices in maintaining the output at the logic high level. For $V_L$ noise, the situation is just the opposite. Devices in the pull-down path are weakened (minimum body voltages for nFETs and maximum body voltages for pFETs), while devices in the pull-up path are strengthened (maximum body voltages for nFETs and minimum body voltages for pFETs).

Figure 9A:
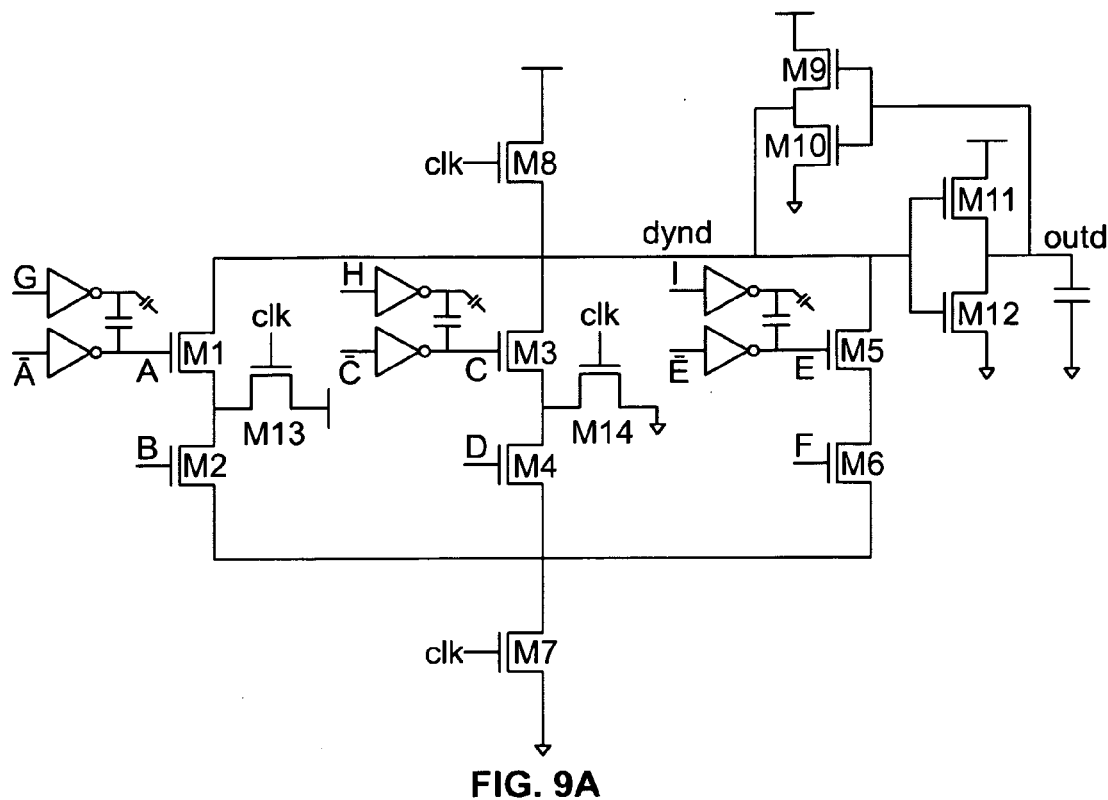
FIGS. 9a and 9b are illustrative diagram showing an exemplary circuit.
Figure 9B:
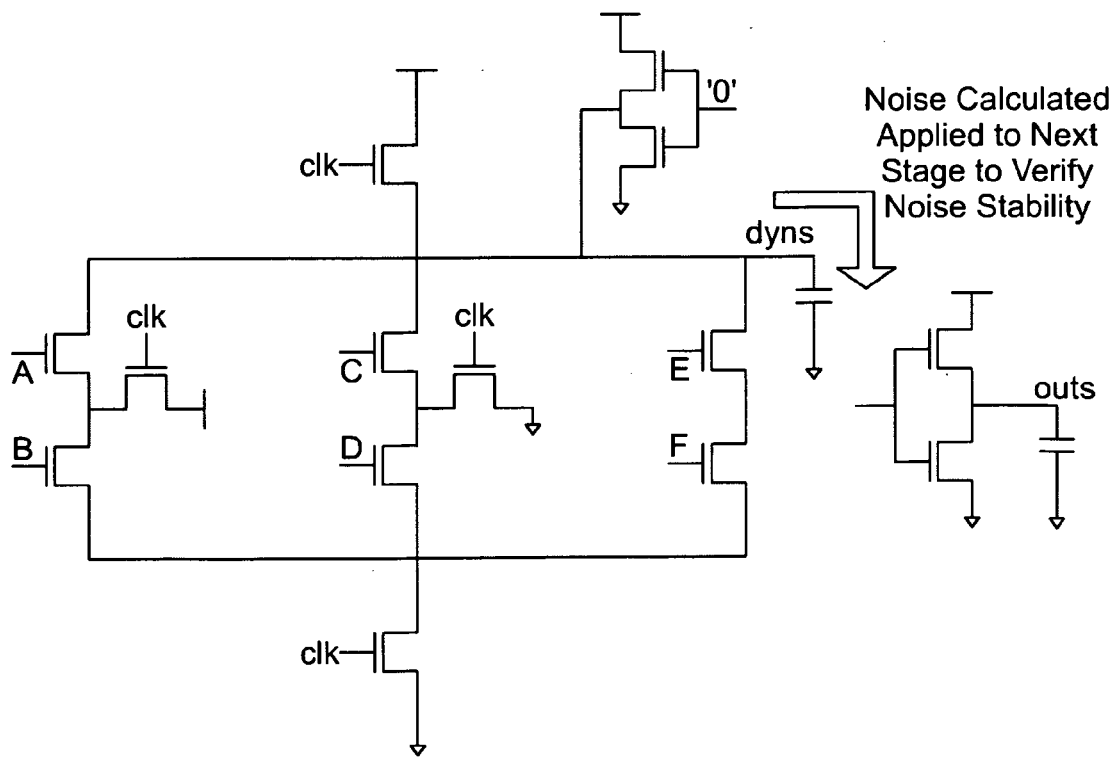

The second important consideration in the static noise analysis of PD-SOI circuits is that in calculating both propagated noise and in verifying noise stability, a parasitic bipolar leakage current may also be activated. Because of this, to achieve the worst-case, the arrival time of the input noise must be varied to maximize the output noise; that is, make sure that the noise introduced by parasitic bipolar leakage is superimposing maximally with the propagated noise Referring next to FIGS. 9a and 9b, a simple circuit is examined as an example of the advantageous use of the noise analysis presented herein. FIG. 9a illustrates a dynamic simulation of a circuit. FIG. 9b shows the CCC decomposition used internally by the static noise analysis engine on the same circuit. In this partitioned circuit, the dynamic node is referred to as dyns and the output of the inverter as outs.

The static noise analysis results and dynamic simulation of the same circuit are compared by vectors which correspond to the worst-case" behavior detected in the static analysis. In the circuit of FIG. 4(a), the coupling noise introduced by the switching of an aggressor (G, H, or I) capacitively coupled to inputs A, C, and E, respectively, after a long period of switching history is considered, called the prelude. Three different preludes are considered as shown in Table V below:

TABLE V

| | Node disposition | | | | | |
|---|---|---|---|---|---|---|
| Prelude | A | B | C | D | E | F |
| 1 | 0 | 0 | 0 | 0 | active | 0 |
| 2 | 0 | 0 | active | 0 | 0 | 0 |
| 3 | 0 | 0 | 0 | 0 | active | active |

The clock period is 10 nsec and the prelude is simulated for 100 musec (so that the body has reached steady state) before the noise is applied. For the purposes of the dynamic simulation, a net that is noted as active in Table V is given a 0→1 transition at the middle of the evaluate cycle, every other evaluate cycle during the prelude. After the prelude, which is different depending on the case considered, the "noise condition" shown in Table VI is applied, introducing $V_L$ coupling noise on node A for case 1, node B for case 2, and node C for cases 3 and 4:

TABLE VI

| Case | Prelude | A | B | C | D | E | F | G | H | I |
|------|---------|---|---|---|---|---|---|---|---|---|
| 1 | 1 | 0 | 1 | 0 | 0 | 0 | 0 | fall | 1 | 1 |
| 2 | 2 | 0 | 0 | 0 | 1 | 0 | 0 | 1 | fall | 1 |
| 3 | 1 | 0 | 0 | 0 | 0 | 0 | 1 | 1 | 1 | fall |
| 4 | 3 | 0 | 0 | 0 | 0 | 0 | 1 | 1 | 1 | fall |

This "noise condition" is identical to the one established by static noise analysis to produce the worst-case $V_H$ noise on node dynd in each case.

Figure 10A:
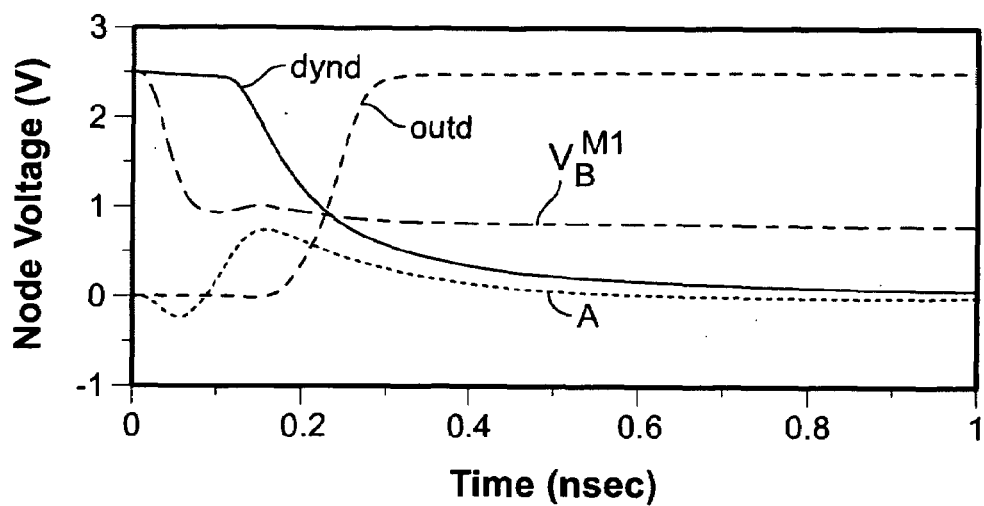
FIGS. 10a–13c are graphs illustrating the results of a comparison between the techniques described herein and a simulation for the an exemplary circuit.
Figure 10B:
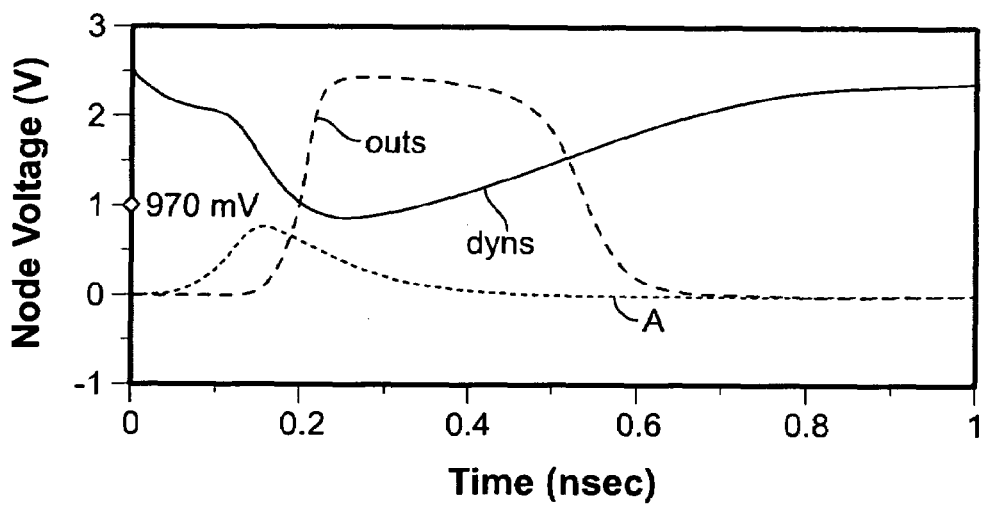
Figure 10C:
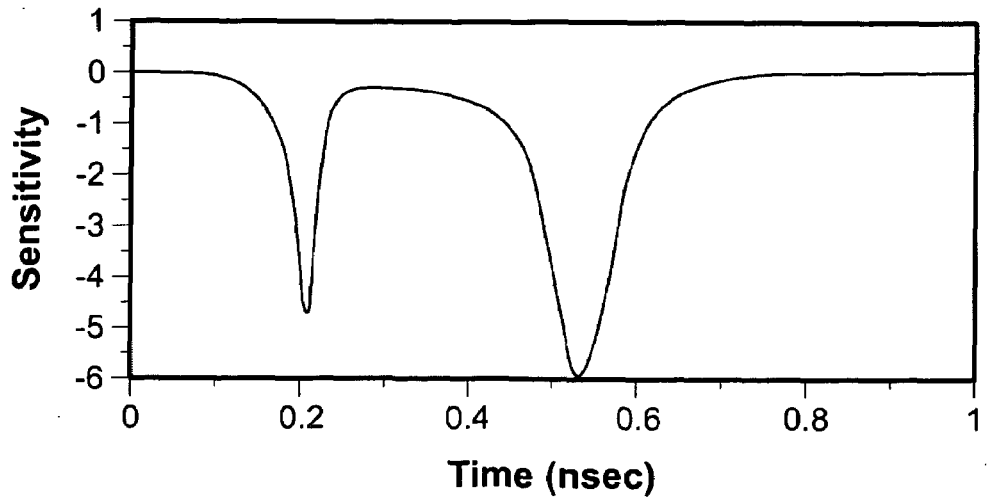
Figure 11A:
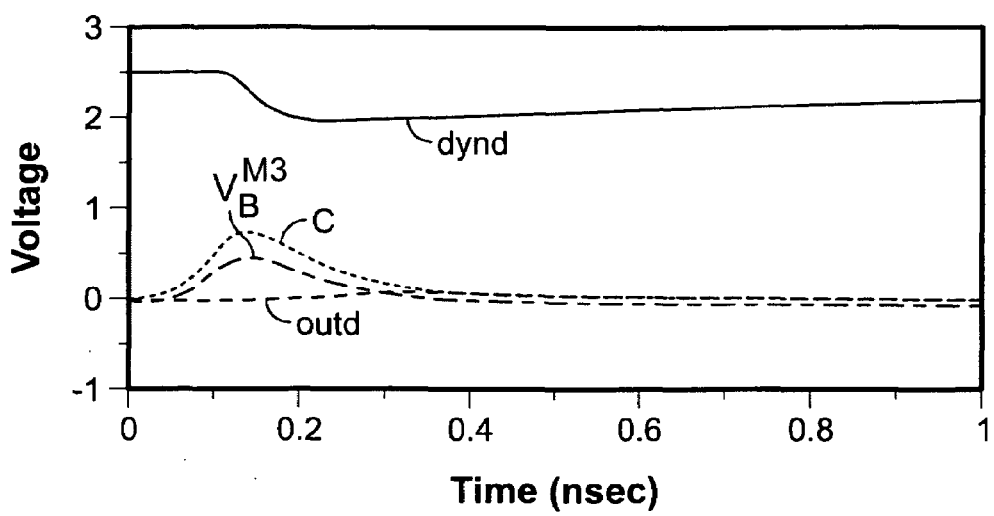
Figure 11B:
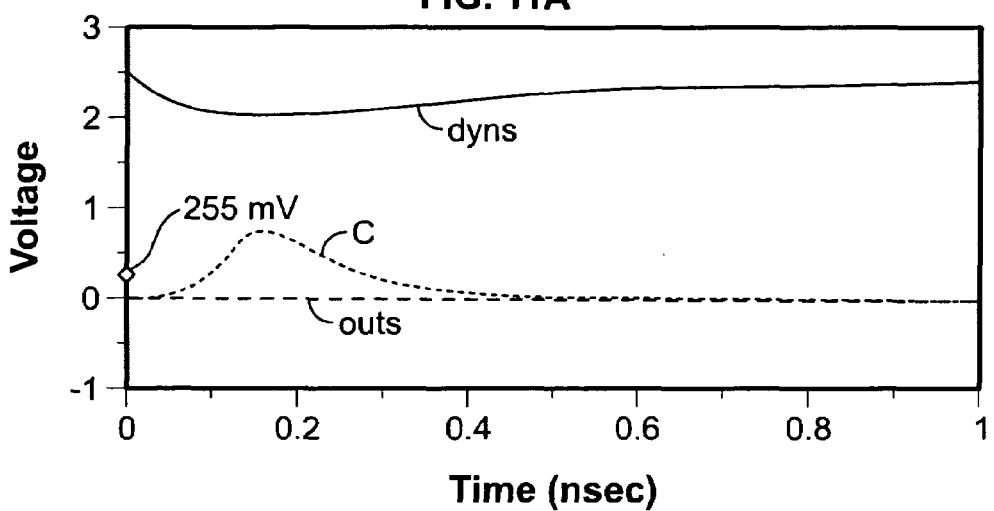
Figure 11C:
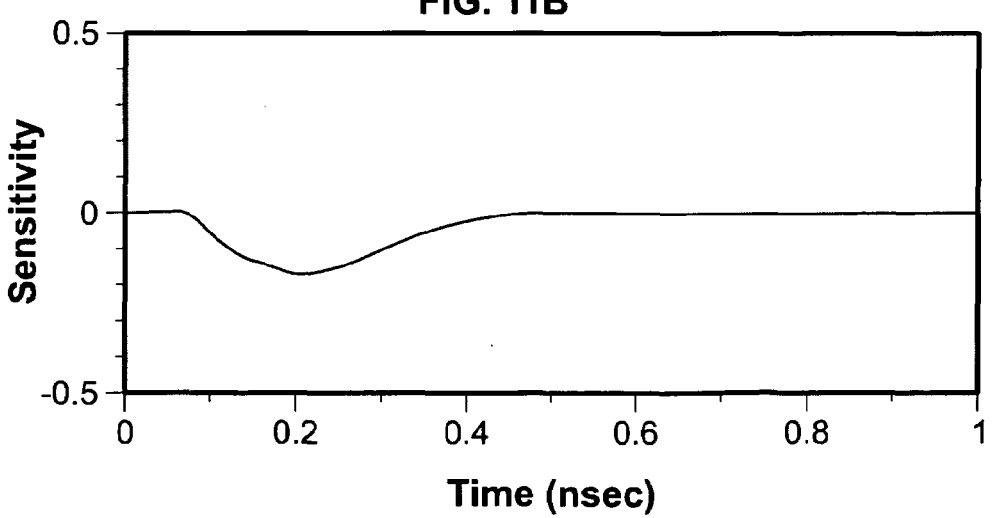
Figure 12A:
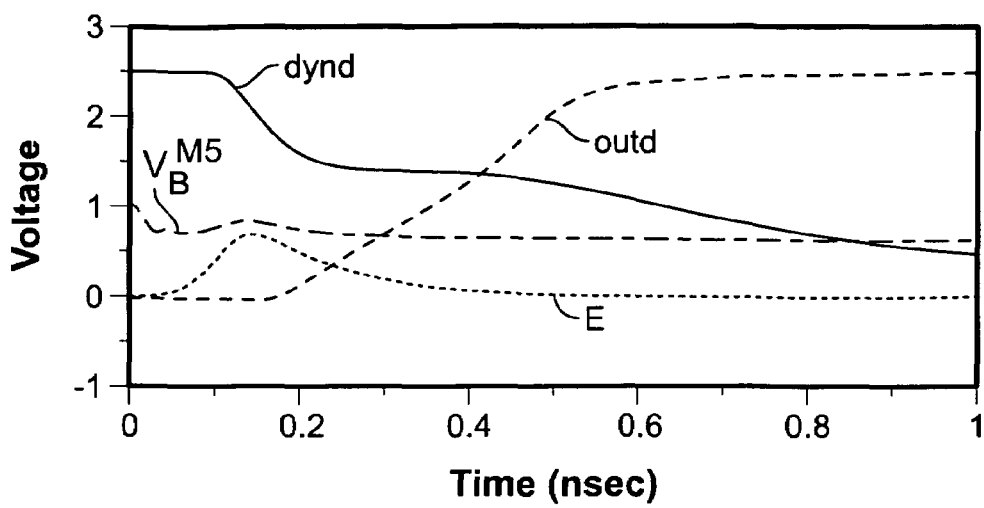
Figure 12B:
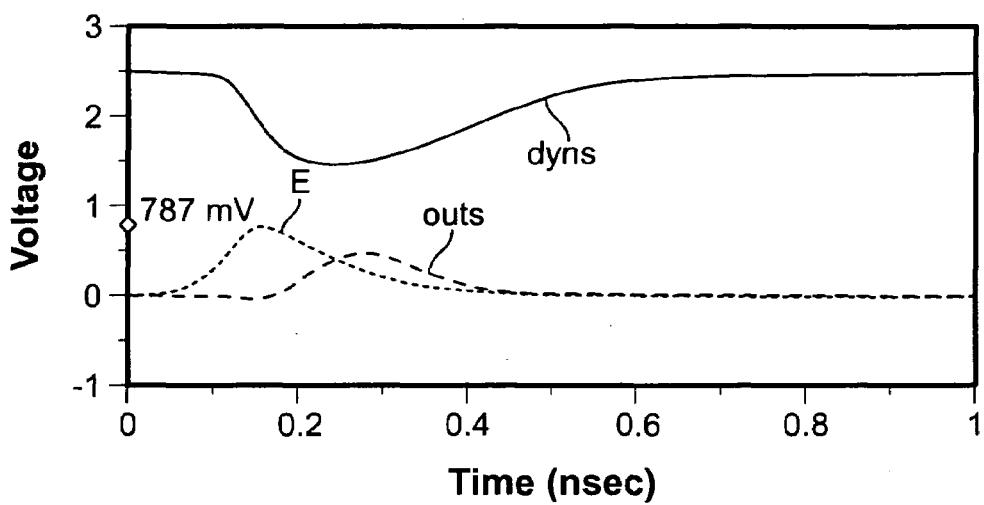
Figure 12C:
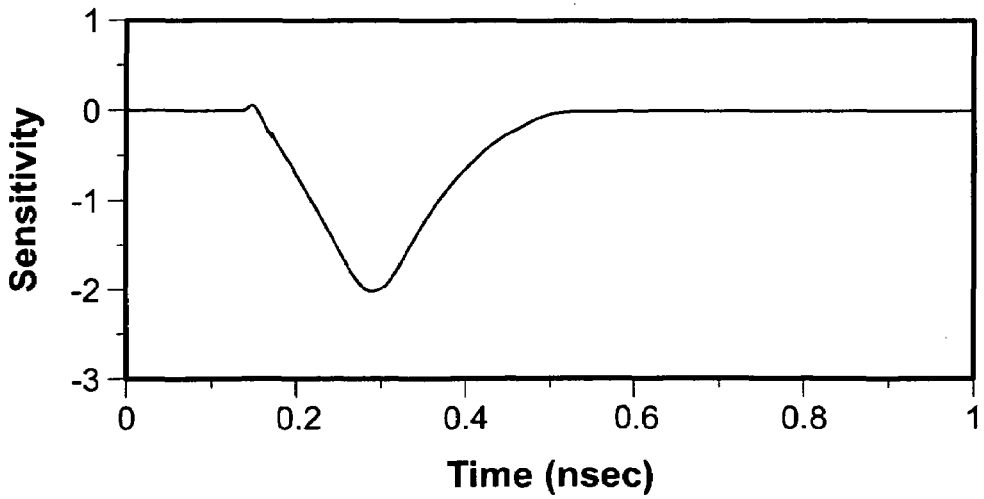
Figure 13A:
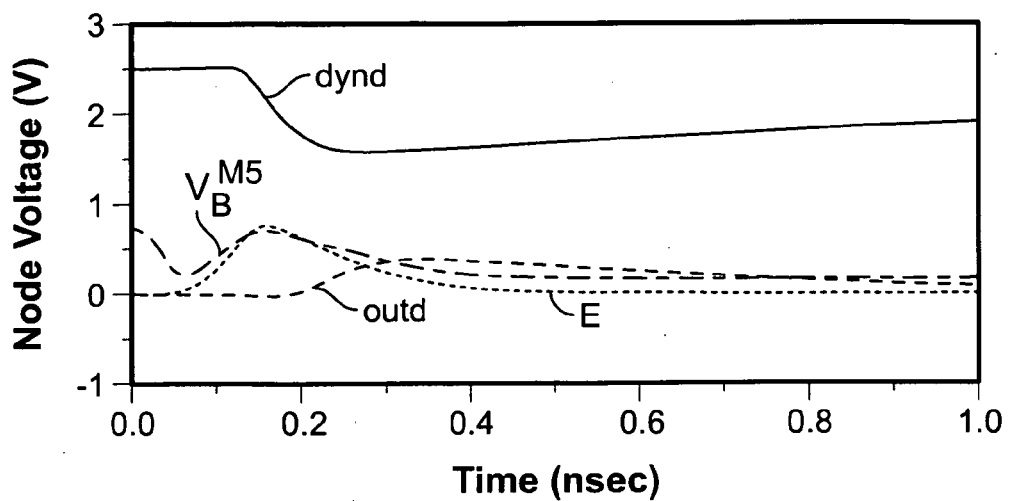
Figure 13B:
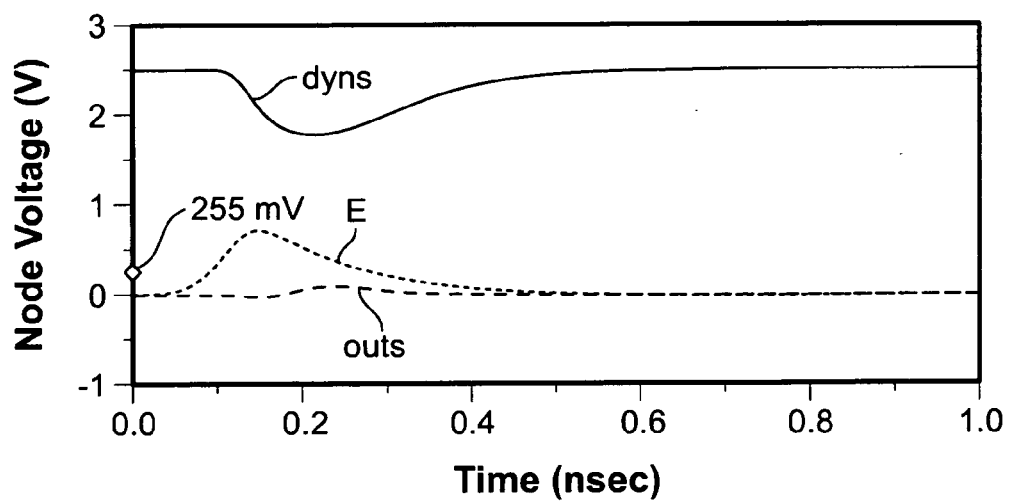
Figure 13C:
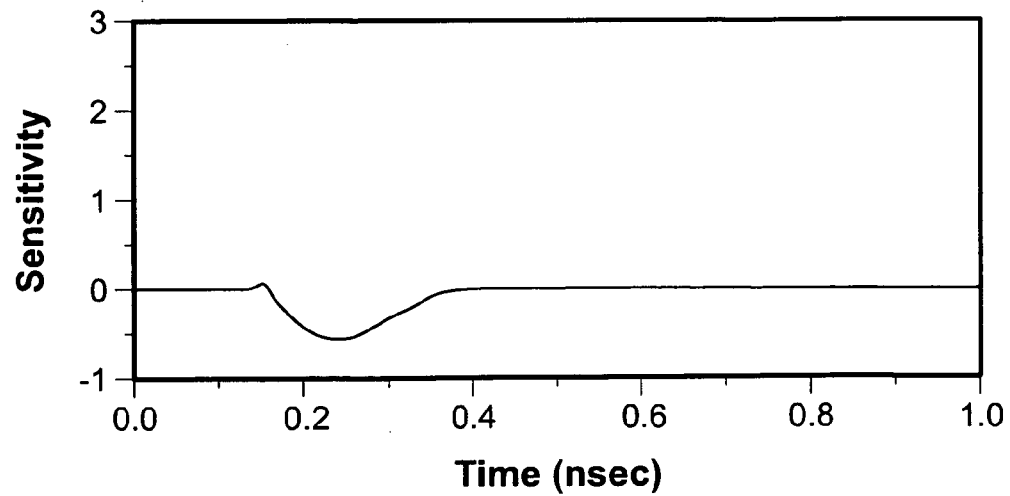

The results of the dynamic circuit simulations are shown in FIGS. 10a and through 13a. In each of these graphs, the dynamic node dynd, the dynamic gate output node outs, the $V_L$ noise being injected on the gate, and the body voltage of the FET receiving the $V_L$ noise on its gate is shown. The dynamic gate is given a "full-latch" keeper so that the failure of the case is immediately evident with the switching of this latch. Cases 1 and 3 show noise failures (as evidenced by the false switching of the latch), while cases 2 and 4 do not. In this dynamic case, the full prelude is simulated before the noise condition is applied.

FIGS. 10b through 13b show the noise on node dyns computed by static noise analysis. It should be noted that in the static analysis, the feedback path is broken and replaced by a tie. In this case, these is no "prelude simulation." Instead, the body voltages of each FET are initialized by the tool with the maximum or minimum value as determined by modified accessibility analysis. The inputs noted as active in Table V (in addition to the clock) are considered as active nets in this analysis. In Case 1, a significant parasitic bipolar current is also present; as a result, the tool adjusts the arrival time of the noise on A to produce the maximum peak noise at dyns.

FIGS. 10c through 13c show the sensitivity of the domino-gate inverter output with respect to the noise calculated on dyns. Failures (as determined by sensitivity exceeding one in magnitude) are correctly predicted for Cases 1 and 3. The noise is so large in Case 1 that the sensitivity has two "peaks" as the inverter is biased through the "high-gain" region and back again.

The noise characteristics are most strongly affected by the body voltages on FETs M1, M3, and M5. The diamonds on the left axis of FIGS. 10b, 11b, 12b, and 13b indicate the "initial condition" body voltages used for FETs M1, M3, M5, and M5, respectively. The actual (from dynamic simulation) and estimated maximum values (from the static noise analysis tool) for these body voltages are compared in Table VII.

TABLE VII

| Transistor | Actual Body voltage (state 5) | Estimated max body voltage (state 5) |
|------------|------------------------------|--------------------------------------|
| M3 for case 2 | 0.05 V | 0.255 V |
| M5 for case 3 | 0.720 V | 0.787 V |
| M5 for case 4 | 0.11 V | 0.255 V |
| M1 for case 1 | 0.95 V | 0.97 V |

In Case 1, transistor M13 charges the internal node between transistors M1 and M2 to $V_{DD}$ every precharge phase. This configuration would be common in bulk CMOS to mitigate charge-sharing noise but is potentially disastrous for SOI since it can allow the body of M1 to easily charge to a very high bias, nearly 1 V. When brought into state 150 by the noise condition, M1 draws bipolar leakage current. The high body voltage also reduces the threshold voltage, making the FET more sensitive to the coupling noise on the gate.

Case 3 is similar, but the fact that net E is under steady switching means that both states 120 and 140 are accessible for FET M5. State 2 accessibility limits the maximum body voltage possible to only about 0.75 V. In this case, the body voltage is not high enough to result in significant parasitic bipolar leakage but the threshold voltage is still reduced enough to result in functional failure.

In Case 2, transistor M14 discharges the internal node between transistors M3 and M4 every cycle. From the point of view of the modified accessibility analysis, this is equivalent to Case 4, in which both E and F are active. The conservative upper bound overestimates the body voltage. The main reason for this discrepancy is the neglect of state 160 which is exerting a downward pressure on the body voltage which is not (in the interests of conservatism) considered in the modified accessibility analysis.

The foregoing merely illustrates the principles of the invention. Various modifications and alterations to the described embodiments will be apparent to those skilled in the art in view of the teachings herein. Gate leakage is an emerging influence on the body voltage and could easily be incorporated in to the estimation technique. It will thus be appreciated that those skilled in the art will be able to devise numerous systems and methods which, although not explicitly shown or described herein, embody the principles of the invention and are thus within the spirit and scope of the invention.

I claim:

1. A method for statically estimating a body voltage of one or more transistors which form digital partially depleted silicon-on-insulator circuit having a predetermined circuit topology comprising said one or more transistors and one or more nets connecting said transistors, comprising the steps of:

a. obtaining one or more device models selected from the group consisting of an n channel Field Effect Transistor model and a p channel Field Effect Transistor model, each corresponding to one of said one or more transistors;

b. abstracting each of said n channel Field Effect Transistor models, if any, and each of said p channel Field Effect Transistor models, if any, to obtain one or more displacement voltages $d_i$, steady-state reference voltages $V_i^{Zero}$, and forward bias reference voltages $V_i^{forward}$, for each of said device models to generate one or more simplified electrical descriptions, each corresponding to one of said one or more transistors;

c. checking said predetermined circuit topology to generate one or more sets of accessible states, each set corresponding to one of said one or more transistors and being indicative of whether under any allowable switching activity, the source, gate or drain could be high or low;

d. performing active net tagging on each of said one or more nets to determine whether any of said one or more nets will switch with regular frequency, e. determining one or more sets of reference state body voltage minima and reference state body voltage maxima, one for each of said one or more transistors, based on corresponding simplified electrical descriptions and corresponding sets of accessible states; and f. ascertaining one or more target state body voltage minima and target state body voltage maxima, one for each of said one or more transistors, based on said determined sets of reference state body voltage minima and reference state body voltage maxima.

2. The method of claim 1, wherein said corresponding simplified electrical descriptions comprise said displacement voltages $d_i$, and said determining step comprises determining said sets of reference state body voltage minima, and reference state body voltage maxima based on corresponding displacement voltages $d_i$, and corresponding set of accessible states, and from said determination from said active net tagging.

3. The method of claim 2, wherein said ascertaining step comprises ascertaining one or more target state body voltage minima and one or more target state body voltage maxima, based on said determined reference state body voltage minima and maxima using modified accessibility analysis.

* * * * *